(12) United States Patent
Kubota et al.

(10) Patent No.: US 11,733,545 B2
(45) Date of Patent: Aug. 22, 2023

(54) ASSEMBLY PROCESS FOR AN ELECTRONIC SOFT CONTACT LENS DESIGNED TO INHIBIT PROGRESSION OF MYOPIA

(71) Applicant: ACUCELA INC., Seattle, WA (US)

(72) Inventors: Ryo Kubota, Seattle, WA (US); Jean-Noël Fehr, Neuchâtel (CH); Hans Bernhard, Schliern (CH); Patrizia Weber, Bern (CH); Alain Saurer, Neuchâtel (CH); Amitava Gupta, Roanoke, VA (US)

(73) Assignee: ACUCELA INC.

( * ) Notice: Subject to any disclaimer, the term of this patent is extended or adjusted under 35 U.S.C. 154(b) by 0 days.

(21) Appl. No.: 17/753,773

(22) PCT Filed: Sep. 15, 2020

(86) PCT No.: PCT/US2020/070542
§ 371 (c)(1),
(2) Date: Mar. 14, 2022

(87) PCT Pub. No.: WO2021/056018
PCT Pub. Date: Mar. 25, 2021

(65) Prior Publication Data
US 2022/0382076 A1 Dec. 1, 2022

Related U.S. Application Data

(60) Provisional application No. 62/900,974, filed on Sep. 16, 2019.

(51) Int. Cl.
*G02C 7/04* (2006.01)
*G02C 11/00* (2006.01)
*G02C 11/04* (2006.01)

(52) U.S. Cl.
CPC ............ *G02C 7/047* (2013.01); *G02C 11/04* (2013.01); *G02C 11/10* (2013.01); *G02C 2202/24* (2013.01)

(58) Field of Classification Search
CPC .......... G02C 7/047; G02C 11/04; G02C 11/10
(Continued)

(56) References Cited

U.S. PATENT DOCUMENTS 6,516,808 B2   2/2003   Schulman
7,018,040 B2   3/2006   Blum
(Continued)

FOREIGN PATENT DOCUMENTS

EP   3153139    4/2017
EP   3413116    12/2018
(Continued)

OTHER PUBLICATIONS

Cook, Colin A., et al., "Phototherapeutic Contact Lens for Diabetic Retinopahty," 2018 IEEE Micro Electro Mechanical Systems, pp. 62-65, XP033335512, (Jan. 21, 2018).
(Continued)

*Primary Examiner* — James R Greece
(74) *Attorney, Agent, or Firm* — FisherBroyles LLP; John Shimmick

(57) ABSTRACT

An opto-electronic module is configured to fit between anterior and posterior surfaces of a contact lens. The opto-electronics module may comprise a plurality of light sources configured to direct a plurality of light beams to a region of the retina away from the fovea and in some embodiments away from the macula. Each of the plurality of light sources may comprises an LED and one or more projection optics. Each of the projection optics can be coupled to an LED with an adhesive prior to placing the opto-electronics module on a layer of contact lens material. The opto-electronics module
(Continued)

may comprise a flex PCB with the plurality of light sources, an antenna, a battery, a capacitor and a processor supported on the flex PCB.

20 Claims, 13 Drawing Sheets

(58) Field of Classification Search
USPC .................................................. 351/159.39
See application file for complete search history.

(56) References Cited

U.S. PATENT DOCUMENTS

| | | | |
|---|---|---|---|
| 8,246,167 | B2 | 8/2012 | Legerton |
| 8,432,124 | B2 | 4/2013 | Foster |
| 8,662,664 | B2 | 3/2014 | Artal Soriano |
| 8,857,983 | B2 | 10/2014 | Pugh |
| 9,345,813 | B2 | 5/2016 | Hogg |
| 9,482,882 | B1 | 11/2016 | Hanover |
| 9,482,883 | B1 | 11/2016 | Meisenholder |
| 9,726,904 | B1 | 8/2017 | Lin |
| 9,763,827 | B2 | 9/2017 | Kelleher |
| 9,885,884 | B2 | 2/2018 | Drobe |
| 9,918,894 | B2 | 3/2018 | Lam |
| 9,962,071 | B2 | 5/2018 | Yates |
| RE47,006 | E | 8/2018 | Ho |
| 10,133,092 | B2 | 11/2018 | Tsubota |
| 10,139,521 | B2 | 11/2018 | Tran |
| 10,146,067 | B2 | 12/2018 | Tsai |
| 10,231,897 | B2 | 3/2019 | Tse |
| 10,268,050 | B2 | 4/2019 | To |
| 10,288,909 | B1 | 5/2019 | Youssef |
| 10,591,745 | B1 | 3/2020 | Lin |
| 10,788,686 | B2 | 9/2020 | Tsai |
| 10,884,264 | B2 | 1/2021 | Hones |
| 10,921,612 | B2 | 2/2021 | Zhou |
| 10,993,515 | B1 | 5/2021 | Kim |
| 11,000,186 | B2 | 5/2021 | Linder |
| 11,163,166 | B1 | 11/2021 | Ebert |
| 11,187,921 | B2 | 11/2021 | Zhou |
| 11,219,287 | B1 | 1/2022 | Kim |
| 11,275,259 | B2 | 3/2022 | Kubota |
| 11,281,022 | B2 | 3/2022 | Buscemi |
| 11,320,674 | B2 | 5/2022 | Kubota |
| 11,358,001 | B2 | 6/2022 | Kubota et al. |
| 11,366,339 | B2 | 6/2022 | Kubota et al. |
| 11,366,341 | B1 | 6/2022 | Kubota et al. |
| 11,402,662 | B2 | 8/2022 | Wyss |
| 11,409,136 | B1 | 8/2022 | Kubota |
| 11,415,818 | B2 | 8/2022 | Olgun |
| 11,444,488 | B2 | 9/2022 | Bohn |
| 11,446,514 | B2 | 9/2022 | Bahmani |
| 11,460,720 | B1 | 10/2022 | Kubota |
| 11,467,423 | B2 | 10/2022 | Buscemi |
| 11,467,426 | B2 | 10/2022 | Kubota |
| 11,467,428 | B2 | 10/2022 | Kubota |
| 11,480,813 | B2 | 10/2022 | Kubota |
| 11,531,216 | B2 | 12/2022 | Kubota |
| 11,583,696 | B2 | 2/2023 | Kubota |
| 11,619,831 | B2 | 4/2023 | Wyss |
| 2002/0186345 | A1 | 12/2002 | Duppstadt |
| 2003/0011745 | A1 | 1/2003 | Molebny |
| 2004/0237971 | A1 | 12/2004 | Radhakrishnan |
| 2004/0246441 | A1 | 12/2004 | Stark |
| 2004/0257529 | A1 | 12/2004 | Thomas |
| 2005/0258053 | A1 | 11/2005 | Sieg |
| 2006/0082729 | A1 | 4/2006 | To |
| 2007/0002452 | A1 | 1/2007 | Munro |
| 2007/0076217 | A1 | 4/2007 | Baker |
| 2007/0115431 | A1 | 5/2007 | Smith, III |
| 2007/0127349 | A1 | 6/2007 | Hotta |
| 2007/0281752 | A1 | 12/2007 | Lewis |
| 2008/0291391 | A1 | 11/2008 | Meyers |
| 2008/0309882 | A1 | 12/2008 | Thorn |
| 2009/0002631 | A1 | 1/2009 | Campbell |
| 2009/0187242 | A1 | 7/2009 | Weeber |
| 2009/0201460 | A1 | 8/2009 | Blum |
| 2009/0204207 | A1 | 8/2009 | Blum |
| 2010/0076417 | A1 | 3/2010 | Suckewer |
| 2010/0294675 | A1 | 11/2010 | Mangano |
| 2010/0296058 | A1 | 11/2010 | Ho |
| 2011/0085129 | A1 | 4/2011 | Legerton |
| 2011/0153012 | A1 | 6/2011 | Legerton |
| 2011/0157554 | A1 | 6/2011 | Kawai |
| 2011/0202114 | A1 | 8/2011 | Kessel |
| 2012/0055817 | A1 | 3/2012 | Newman |
| 2012/0062836 | A1 | 3/2012 | Tse |
| 2012/0199995 | A1 | 8/2012 | Pugh |
| 2012/0206485 | A1 | 8/2012 | Osterhout |
| 2012/0212399 | A1 | 8/2012 | Border |
| 2012/0215291 | A1 | 8/2012 | Pugh |
| 2013/0027655 | A1 | 1/2013 | Blum |
| 2013/0072828 | A1 | 3/2013 | Sweis |
| 2013/0194540 | A1 | 8/2013 | Pugh |
| 2013/0278887 | A1 | 10/2013 | Legerton |
| 2013/0317487 | A1 | 11/2013 | Luttrull |
| 2014/0039048 | A1 | 2/2014 | Bavik |
| 2014/0039361 | A1 | 2/2014 | Yin |
| 2014/0194773 | A1 | 7/2014 | Pletcher |
| 2014/0218647 | A1 | 8/2014 | Blum |
| 2014/0240665 | A1 | 8/2014 | Pugh |
| 2014/0268029 | A1 | 9/2014 | Pugh |
| 2014/0277291 | A1 | 9/2014 | Pugh |
| 2014/0379054 | A1 | 12/2014 | Cooper |
| 2015/0057701 | A1 | 2/2015 | Kelleher |
| 2015/0109574 | A1 | 4/2015 | Tse |
| 2015/0160477 | A1 | 6/2015 | Dai |
| 2015/0200554 | A1 | 7/2015 | Marks |
| 2015/0241706 | A1 | 8/2015 | Schowengerdt |
| 2016/0016004 | A1 | 1/2016 | Hudson |
| 2016/0056498 | A1 | 2/2016 | Flitsch |
| 2016/0067037 | A1 | 3/2016 | Rosen |
| 2016/0067087 | A1 | 3/2016 | Tedford |
| 2016/0091737 | A1 | 3/2016 | Kim |
| 2016/0143801 | A1 | 5/2016 | Lam |
| 2016/0158486 | A1 | 6/2016 | Colbaugh |
| 2016/0212404 | A1 | 7/2016 | Maiello |
| 2016/0270656 | A1 | 9/2016 | Samec |
| 2016/0377884 | A1 | 12/2016 | Lau |
| 2017/0000326 | A1 | 1/2017 | Samec |
| 2017/0001032 | A1 | 1/2017 | Samec |
| 2017/0010480 | A1 | 1/2017 | Blum |
| 2017/0014074 | A1 | 1/2017 | Etzkorn |
| 2017/0055823 | A1 | 3/2017 | Lu |
| 2017/0072218 | A1 | 3/2017 | Rucker |
| 2017/0078623 | A1 | 3/2017 | Hilkes |
| 2017/0097519 | A1 | 4/2017 | Lee |
| 2017/0115512 | A1 | 4/2017 | Pugh |
| 2017/0184875 | A1 | 6/2017 | Newman |
| 2017/0229730 | A1 | 8/2017 | Flitsch |
| 2017/0236255 | A1 | 8/2017 | Wetzstein |
| 2017/0270636 | A1 | 9/2017 | Shtukater |
| 2017/0276963 | A1 | 9/2017 | Brennan |
| 2017/0307779 | A1 | 10/2017 | Marullo |
| 2018/0017810 | A1 | 1/2018 | Wu |
| 2018/0017814 | A1 | 1/2018 | Tuan |
| 2018/0052319 | A1 | 2/2018 | McCabe |
| 2018/0055351 | A1 | 3/2018 | Yates |
| 2018/0074322 | A1 | 3/2018 | Rousseau |
| 2018/0090958 | A1 | 3/2018 | Steger |
| 2018/0092738 | A1 | 4/2018 | Tai |
| 2018/0136486 | A1 | 5/2018 | MacNamara |
| 2018/0136491 | A1 | 5/2018 | Ashwood |
| 2018/0161231 | A1 | 6/2018 | Tse |
| 2018/0173010 | A1 | 6/2018 | Harant |
| 2018/0188556 | A1 | 7/2018 | Portney |
| 2018/0221140 | A1* | 8/2018 | Rosen .................. A61F 2/1602 |
| 2018/0264284 | A1 | 9/2018 | Alvarez |
| 2018/0275427 | A1 | 9/2018 | Lau |
| 2018/0345034 | A1 | 12/2018 | Butzloff |
| 2019/0033618 | A1 | 1/2019 | Choi |
| 2019/0033619 | A1 | 1/2019 | Neitz |
| 2019/0038123 | A1 | 2/2019 | Linder |
| 2019/0049730 | A1 | 2/2019 | Miller |

(56) References Cited

U.S. PATENT DOCUMENTS

| | | |
|---|---|---|
| 2019/0076241 A1 | 3/2019 | Alarcon Heredia |
| 2019/0092545 A1 | 3/2019 | Oag |
| 2019/0107734 A1 | 4/2019 | Lee |
| 2019/0113757 A1 | 4/2019 | Van Heugten |
| 2019/0129204 A1 | 5/2019 | Tsubota |
| 2019/0227342 A1 | 7/2019 | Brennan |
| 2019/0235279 A1 | 8/2019 | Hones |
| 2019/0247675 A1 | 8/2019 | Legerton |
| 2019/0250413 A1 | 8/2019 | Martin |
| 2019/0250432 A1* | 8/2019 | Kim ................... G02C 11/10 |
| 2019/0314147 A1 | 10/2019 | Blum |
| 2020/0033637 A1 | 1/2020 | Jamshidi |
| 2020/0073148 A1 | 3/2020 | Alhaideri |
| 2020/0089023 A1 | 3/2020 | Zhou |
| 2020/0108272 A1 | 4/2020 | Bahmani |
| 2020/0110265 A1 | 4/2020 | Serdarevic |
| 2020/0133024 A1 | 4/2020 | Paune Fabre |
| 2020/0142219 A1 | 5/2020 | Rousseau |
| 2020/0183169 A1 | 6/2020 | Peng |
| 2020/0264455 A1 | 8/2020 | Olgun |
| 2020/0360184 A1 | 11/2020 | Xiao |
| 2021/0018762 A1 | 1/2021 | Zheleznyak |
| 2021/0031051 A1 | 2/2021 | Kubota |
| 2021/0048690 A1 | 2/2021 | Guillot |
| 2021/0069524 A1 | 3/2021 | Kubota |
| 2021/0231977 A1 | 7/2021 | Zhou |
| 2021/0263336 A1 | 8/2021 | Gupta |
| 2021/0298440 A1 | 9/2021 | Kim |
| 2021/0329764 A1 | 10/2021 | Linder |
| 2021/0356767 A1 | 11/2021 | Kubota |
| 2021/0376661 A1 | 12/2021 | Bohn |
| 2021/0379399 A1 | 12/2021 | Buscemi |
| 2021/0382325 A1 | 12/2021 | Kubota |
| 2021/0382326 A1 | 12/2021 | Kubota |
| 2021/0389607 A1 | 12/2021 | Buscemi |
| 2022/0057651 A1 | 2/2022 | Segre |
| 2022/0107508 A1 | 4/2022 | Zhou |
| 2022/0179213 A1 | 6/2022 | Zhou |
| 2022/0231523 A1 | 7/2022 | Bristol |
| 2022/0257972 A1 | 8/2022 | Kubota |
| 2022/0299795 A1 | 9/2022 | Wyss |
| 2022/0397775 A1 | 12/2022 | Bahmani |

FOREIGN PATENT DOCUMENTS

| | | |
|---|---|---|
| KR | 20180038359 A | 4/2018 |
| TW | M356929 | 5/2009 |
| TW | 201234072 | 8/2012 |
| TW | 201734580 | 10/2017 |
| WO | 2009074638 A3 | 6/2009 |
| WO | 2009121810 | 10/2009 |
| WO | 2010015255 A1 | 2/2010 |
| WO | 2010043599 | 4/2010 |
| WO | 2011089042 | 7/2011 |
| WO | 2012136470 | 10/2012 |
| WO | 2013087518 | 6/2013 |
| WO | 2013158418 | 10/2013 |
| WO | 2014033035 | 3/2014 |
| WO | 2014050879 | 4/2014 |
| WO | 2014191460 | 12/2014 |
| WO | 2015063097 | 5/2015 |
| WO | 2015186723 | 12/2015 |
| WO | 2015192117 | 12/2015 |
| WO | 2017094886 | 6/2017 |
| WO | 2017097708 | 6/2017 |
| WO | 2018014712 | 1/2018 |
| WO | 2018014960 | 1/2018 |
| WO | 2018075229 | 4/2018 |
| WO | 2018085576 | 5/2018 |
| WO | 2018088980 | 5/2018 |
| WO | 2018208724 | 11/2018 |
| WO | 2019114463 | 6/2019 |
| WO | 2019191510 | 10/2019 |
| WO | 2019217241 | 11/2019 |
| WO | 2020014074 | 1/2020 |
| WO | 2020014613 | 1/2020 |
| WO | 2020028177 | 2/2020 |
| WO | 2020069232 | 4/2020 |
| WO | 2021022193 | 2/2021 |
| WO | 2021056018 | 3/2021 |
| WO | 2021116449 | 6/2021 |
| WO | 2021168481 | 8/2021 |
| WO | 2021231684 | 11/2021 |
| WO | 2021252318 | 12/2021 |
| WO | 2021252319 | 12/2021 |
| WO | 2021252320 | 12/2021 |
| WO | 2022217193 | 10/2022 |
| WO | 2022258572 | 12/2022 |

OTHER PUBLICATIONS

Adler, Daniel, et al., "The possible effect of under correction on myopic progression in children," Clin Exp Optom., 89:315-321 (2006).

Aleman, Andrea C., et al.,, "Reading and Myopia: Contrast Polarity Matters," Scientific Reports, 8 pages (2018).

Arden, G.B., et al., "Does dark adaptation exacerbate diabetic retinopathy? Evidence and a linking hypothesis," Vision Research 38:1723-1729 (1998).

Arden, GB, et al, "Regression of eariy diabetic macular edema is associated with prevention of dark adaptation", in Eye, (2011). 25, pp. 1546-1554.

Benavente-Perez, A., et al., "Axial Eye Growth and Refractive Error Development Can BE Modified by Exposing the Peripheral Retina to Relative Myopic or Hyperopic Defocus," Invest Ophthalmol Vis Sci., 55:6765-6773 (2014).

Bonar, Jr, et al, "High brightness low power consumption microLED arrays", in SPIE DigitalLibrary.org/conference-proceedings-of-spie, SPIE OPTO, 2016, San Francisco, California, United States, Abstract Only.

Carr, Brittany J., et al., "The Science Behind Myopia," retrieved from https://webvision.med.utah.edu/book/part-xvii-refractive-errors/the-science-behind-myopia-by-brittany-j-carr-and-william-k-stell/, 89 pages (2018).

Chakraborty, R., et al., "Diurnal Variations in Axial Length, Choroidal Thickness, Intraocular Pressure, and Ocular Biometrics," IOVS, 52(8):5121-5129 (2011).

Chakraborty, R., et al., "Hyperopic Defocus and Diurnal Changes in Human Choroid and Axial Length," Optometry and Visual Science, 90(11):1187-1198 (2013).

Chakraborty, R., et al., "Monocular Myopic Defocus and Daily Changes in Axial Length and Choroidal Thickness of human Eyes," Exp Eye Res, 103:47-54 (2012).

Cooper, J., et al, "Current status of the development and treatment of myopia", Optometry, 83:179-199 (2012).

Cooper, J., et al., "A Review of Current Concepts of the Etiology and Treatment of Myopia," Eye & Contact Lens, 44(4):231-247 (Jul. 2018).

Demory, B., et al, "Integrated parabolic microlenses on micro LED color pixels", in Nanotechnology, (2018); 29, 16, pp. 1018, Abstract Only.

Dolgin, Elie, "The Myopia Boom," Nature 519:276-278 (2015).

Edrington, Timothy B., "A literature review: The impact of rotational stabilization methods on toric soft contact lens performance," Contact Lens & Anterior Eye, 34:104-110 (2011).

Flitcroft, D.I., "The complex interactions of retinal, optical and environmental factors in myopia aetiology," 31(6):622-660 (2012).

Garner, L.F., et al., "Crystalline Lens Power in Myopia," Optometry and Vision Science, 69:863-865 (1992).

Gwiazda, Jane, "Treatment Options for Myopia," retrieved from https://www.ncbi.nlm.nih.gov/pmc/articles/PMC2729053/, Optom Vis Sci., 86(6):624-628 (Jun. 2009).

Gwiazda, Jane, et al, "A Randomized Clinical Trial of Progressive Addition Lenses versus Single Vision Lenses on the Progression of Myopia in Children", Invest Ophthalmol Vis Sci, 44:1492-500 [PubMed: 12657584] (2003).

Haglund, Erik, et al., "Multi-wavelength VCSEL arrays using high-contrast gratings," Proc. of SPIE vol. 10113, 7 pages (2017).

(56) References Cited

OTHER PUBLICATIONS

Hammond, D.S., et al., "Dynamics of active emmetropisation in young chicks—influence of sign and magnitude of imposed defocus" Ophthalmic Physiol Opt. 33:215-222 (2013).

Henry W., "MicroLED Sources enable diverse ultra-low power applications", in Photonic Spectra, 2013.

International Search Report and Written Opinion for PCT/US2020/070542, 11 pages (dated Dec. 21, 2020).

Jayaraman, V., et al., "Recent Advances in MEMS-VCSELs for High Performance Structural and Functional SS-OCT Imaging," Proc. of SPIE vol. 8934, retrieved from http://proceedings.spiedigitallibrary.org/ on Dec. 1, 2015 (2014).

Jones, D., "Measure Axial Length to Guide Myopia Management," Review of Myopia Management, 5 pages (Apr. 9, 2020).

Kur, Joanna, et al., "Light adaptation does not prevent early retinal abnormalities in diabetic rats," Scientific Reports, 8 pages (Feb. 8, 2016).

Lagreze, Wolf A., et al., "Preventing Myopia," retrieved from https://www.ncbi.nlm.nih.gov/pmc/articles/PMC5615392/, Disch Arztebl Int., 114(35-36):575-580 (Sep. 2017).

Lam, Carly Siu Yin, et al., "Defocus Incorporated Multiple Segments (DIMS) spectacle lenses slow myopia progression: a 2-year randomised clinical trial," Br. J. Ophthalmol 0:1-6 (2019).

Leo, Seo-Wei, et al., "An evidence-based update on myopia and interventions to retard its progression," J AAPOS, 15(2):181-189 (Apr. 2011).

Lingley, A.R., et al, : A single pixel wireless contact lens display, in J Micromech. Microeng., 2011; 21, 125014; doi:10.1088/0960-1317/21/12/125014, Abstract Only.

Martin, J.A., et al., "Predicting and Assessing Visual Performance with Multizone Bifocal Contact Lenses," Optom Vis Sci, 80(12):812-819 (2003).

Matkovic, K., et al., "Global Contrast Factor—a New Approach to Image Contrast," Computational Aesthetics in Graphics, Visualization and Imaging, 9 pages (2005).

McKeague C, et al. "Low-level night-time light therapy for age-related macular degeneration (ALight): study protocol for a randomized controlled trial", in Trials 2014, 15:246, http://www.trialsjournal.com/content/15/1/246.

Moreno, I, "Creating a desired lighting pattern with an LED array" in Aug. 2008, Proceedings of SPIE—The International Society for Optical Engineering 7058, DOI: 10.1117/12.795673.

Moreno, I., "Modeling the radiation pattern of LEDS", in Optics Express, 2008; 16, 3 pp. 1808.

Nickla, Debora L., et al., "Brief hyperopic defocus or form deprivation have varying effects on eye growth and ocular rhythms depending on the time-of-day of exposure," Exp Eye Res. 161:132-142 (Aug. 2017).

Ramsey, DJ, and Arden, GB, "Hypoxia and dark adaptation in diabetic retinopathy: Interactions, consequences and therapy", in Microvascular Complications-Retinopathy (JK Sun, ed.), Cur Dab Rep (2015) 15: 118, DOI 10.1007/s11892-015-0686-2, Abstract Only.

Read, Scott A., et al., "Choroidal changes in human myopia: insights from optical coherence tomography imaging," Clin Exp Optom, 16 pages (2018).

Read, Scott A., et al., "Human Optical Axial Length and Defocus," IOVS, 51(12):6262-6269 (2010).

Shivaprasad, S, et al, "Clinical efficacy and safety of a light mask for prevention of dark adaptation in treating and preventing progression of early diabetic macular oedema at 24 months (CLEOPATRA): a multicentre, phase 3, randomised controlled trial," in www.thelancet.com/diabetes-endocrinology vol. 6, pp. 382-391 ( May 2018).

Smith, III, Earl L., "Optical treatment strategies to slow myopia progression: Effects of the visual extent of the optical treatment zone," retrieved from https://www.ncbi.nlm.nih.gov/pmc/articles/PMC3624048/, Exp Eye Res., 114:77-88 (Sep. 2013).

Srinivasan, S., "Ocular axes and angles: Time for better understanding," J. Cataract Refract. Surg., 42:351-352 (Mar. 2016).

Torii, Hidemasa, et al., "Violet Light Exposure Can Be a Preventive Strategy Against Myopia Progression," EBioMedicine 15:210-219 (2017).

U.S. Appl. No. 17/302,479, filed May 4, 2021 (60 pages).

Wallman, Josh, et al., "Homeostasis of Eye Growth and the Question of Myopia," Neuron, 43:447-468 (2004).

Wolffsohn, James A., et al., "Impact of Soft Contact Lens Edge Design and Midperipheral Lens Shape on the Epithelium and Its Indentation With Lens Mobility," IOVS, 54(9):6190-6196 (2013).

Brennan NA, Toubouti YM, Cheng X, Bullimore MA. Efficacy in myopia control. Prog Retin Eye Res. Jul. 2021; 83:100923. Epub Nov. 27, 2020.

Walline JJ, Lindsley K, Vedula SS, Cotter SA, Mutti DO, Twelker JD. Interventions to slow progression of myopia in children. Cochran Database Syst Rev. Dec. 7, 2011; (12):CD004916.

Zhou WJ, Zhang YY, Li H, Wu YF, Xu J, Lv S, Li G, Liu SC, Song SF. Five-year progression of refractive errors and incidence of myopia in school-aged children in western China. J Epidemiol. Jul. 5, 2016; 26(7):386-95. Epub Feb. 13, 2016.

\* cited by examiner

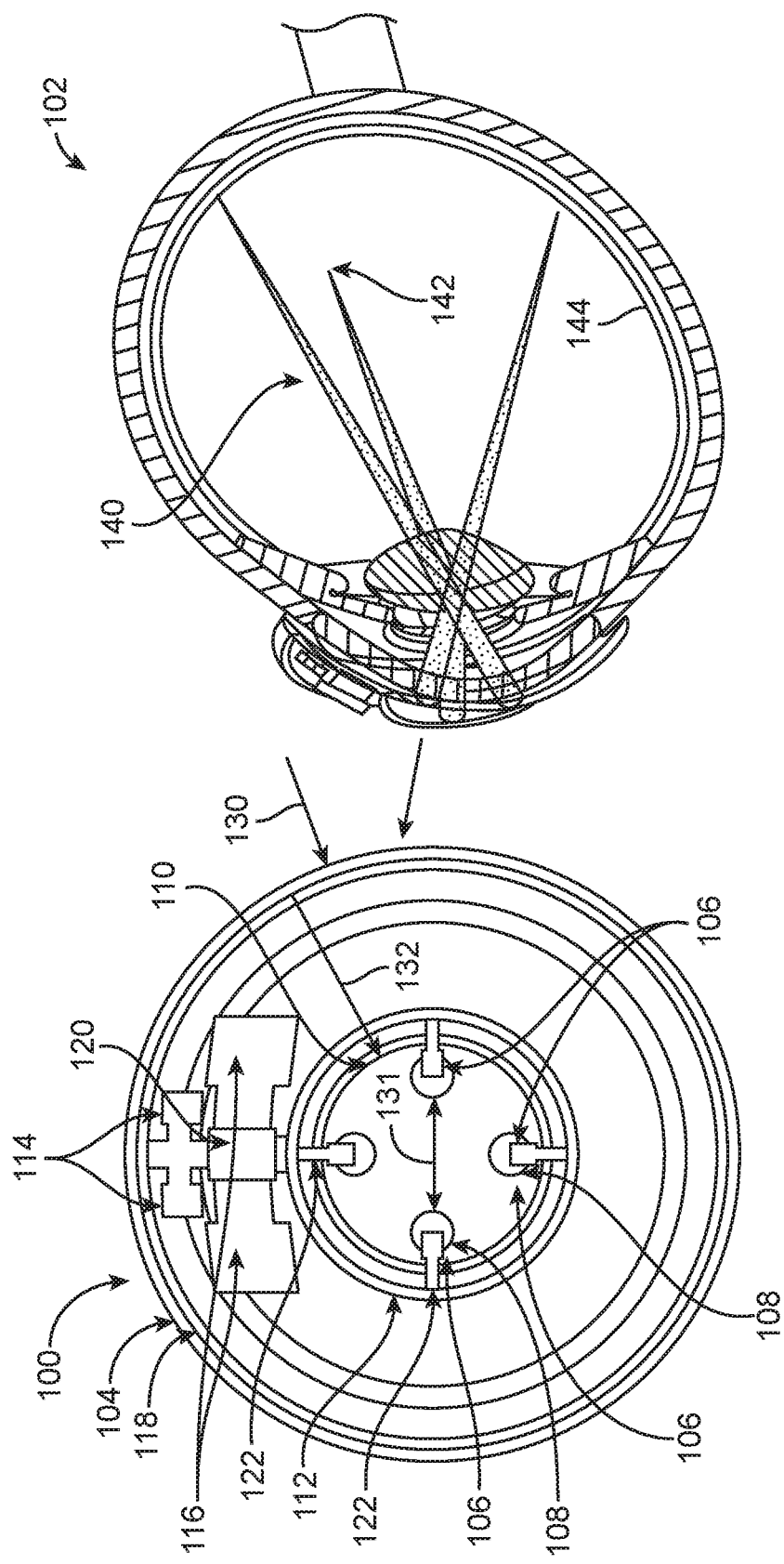

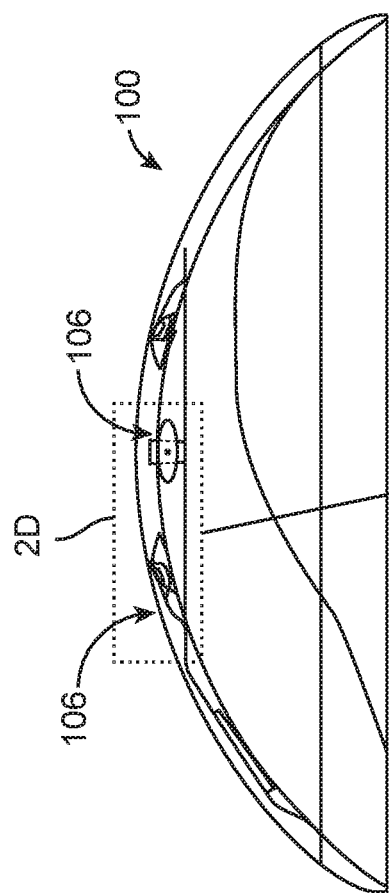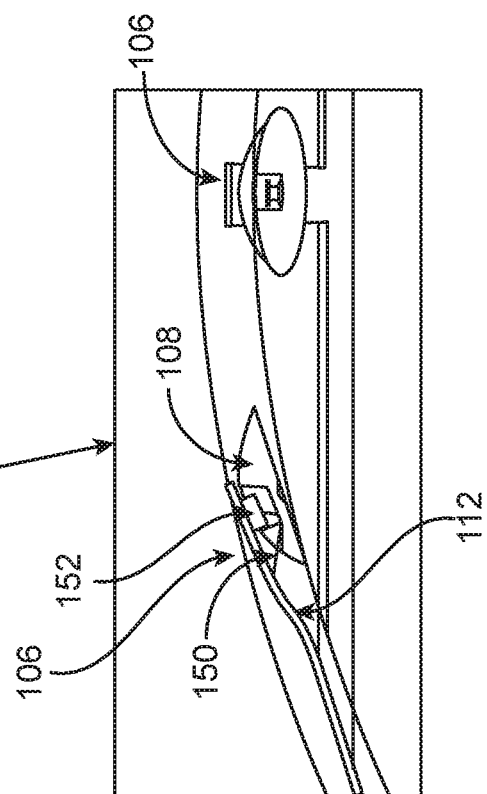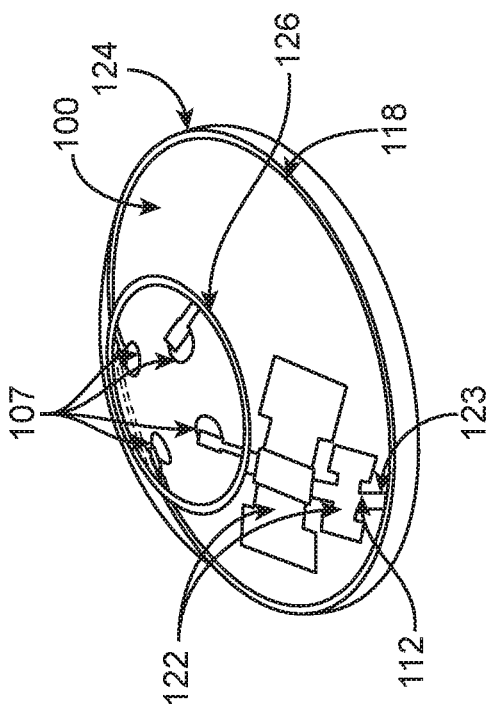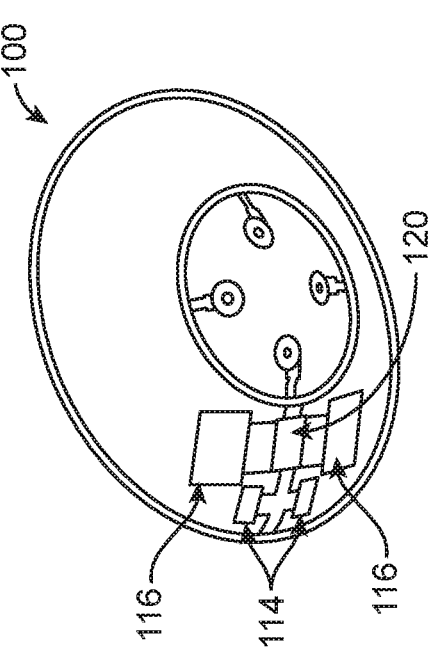

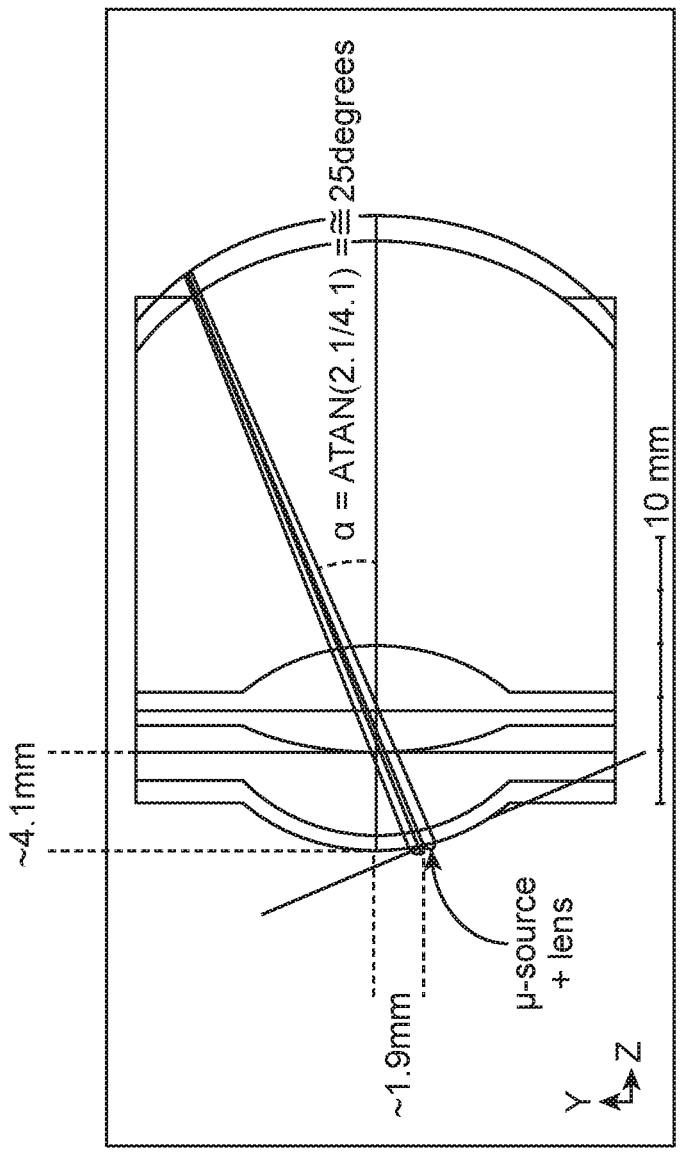
FIG. 3C
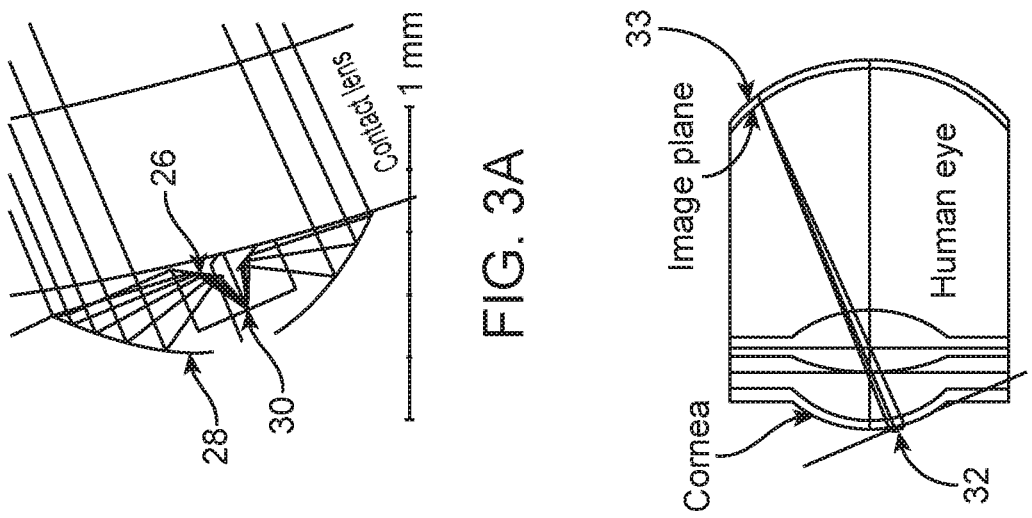
FIG. 3A
FIG. 3B

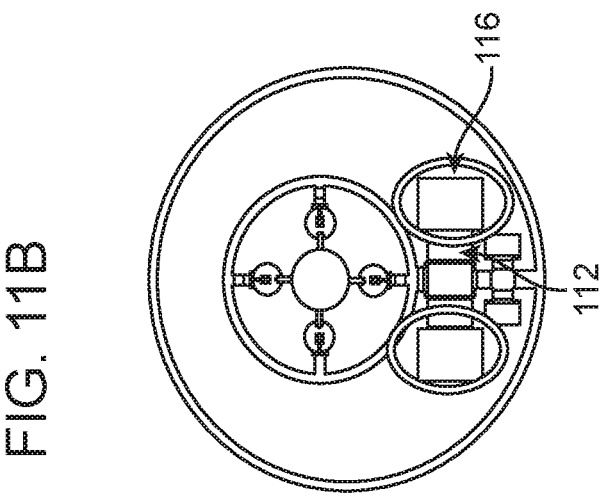
FIG. 11B
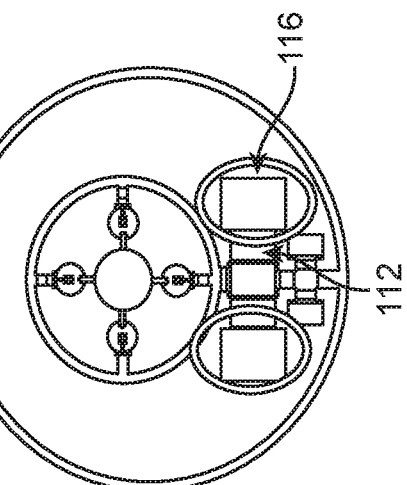
FIG. 11E
| Case size | Pad dimesions (±0.02 μm) | | | | | | |
|---|---|---|---|---|---|---|---|
| | A | B | C | D | E | F | G |
| 0201 | 0.80 | 0.60 | 0.15 | 0.3 | 0.1 | 0.4 | 0.1 |
| 0402 | 1.20 | 0.70 | 0.3 | 0.4 | 0.1 | 0.5 | 0.1 |
| 0603 | 1.80 | 1.10 | 0.4 | 0.8 | 0.1 | 0.9 | 0.1 |
FIG. 11A
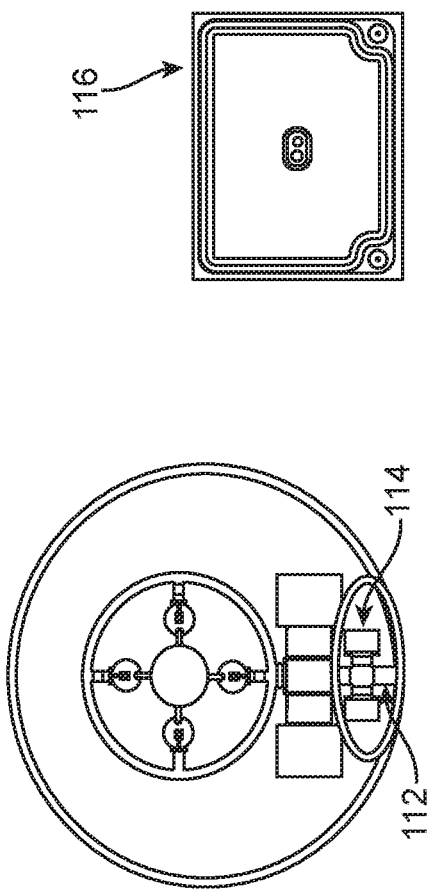
FIG. 11D
FIG. 11C

ASSEMBLY PROCESS FOR AN ELECTRONIC SOFT CONTACT LENS DESIGNED TO INHIBIT PROGRESSION OF MYOPIA

RELATED APPLICATIONS

This application is a 371 national phase of PCT/US2020/070542, filed Sep. 15, 2020, published as WO 2021/056018, on Mar. 25, 2021, and claims the benefit of U.S. Provisional Application No. 62/900,974, filed Sep. 16, 2019, the disclosures of which are incorporated, in their entirety, by this reference.

The subject matter of the present application is related to PCT/US2020/044571, filed Jul. 31, 2020, entitled "DEVICE FOR PROJECTING IMAGES ON THE RETINA", and PCT/US2019/043692, filed Jul. 26, 2019, published as WO/2020/028177 on Feb. 6, 2020, entitled "ELECTRONIC CONTACT LENS TO DECREASE MYOPIA PROGRESSION", the entire disclosures of which are incorporated herein by reference.

BACKGROUND

Prior methods and apparatus for treating myopia can be less than ideal in at least some respects. It would be helpful to decrease the progression of myopia by illuminating the retina in order to decrease the progression of myopia, and ideally to reverse myopia.

At least some of the prior approaches to manufacturing smart contact lenses are less than ideally suited for manufacturing a contact lens to treat myopia with a plurality of light sources.

SUMMARY

In some embodiments, an opto-electronic module to treat refractive error such as myopia is configured to fit between anterior and posterior surfaces of a contact lens. The contact lens comprising the opto-electronic module can be configured to alter the refractive error of the eye or a progression of refractive error by providing defocused light the retina of the eye. The defocused light can alter one or more of an axial length of the eye, growth of the axial length of the eye, or a choroidal thickness of the eye, which are related to refractive properties of the eye. The opto-electronics module may comprise a plurality of light sources configured to direct a plurality of light beams to a region of the retina away from the fovea and in some embodiments away from the macula. In some embodiments, each of the plurality of light sources comprises an LED and one or more projection optics. Each of the projection optics can be coupled to an LED with an adhesive prior to placing the opto-electronics module on a layer of contact lens material. In some embodiments, the opto-electronics module is placed on a layer of contact lens material and adhered to the layer. In some embodiments, the opto-electronics module is positioned between a first layer of a contact lens and a second layer of a contact lens and adhered to the first and second layers of the contact lens with an adhesive. In some embodiments, the opto-electronics module comprises a flex PCB with the plurality of light sources, an antenna, a battery, a capacitor and a processor supported on the flex PCB.

INCORPORATION BY REFERENCE

All patents, applications, and publications referred to and identified herein are hereby incorporated by reference in their entirety, and shall be considered fully incorporated by reference even though referred to elsewhere in the application.

BRIEF DESCRIPTION OF THE DRAWINGS

A better understanding of the features, advantages and principles of the present disclosure will be obtained by reference to the following detailed description that sets forth illustrative embodiments, and the accompanying drawings of which:

FIG. 1A shows an electronic contact lens for one or more of the prevention of myopia progression or the reversal of myopia, in accordance with some embodiments;

FIG. 1B shows an electronic contact lens as in FIG. 1A placed on an eye;

FIGS. 2A to 2D different views of the electronic contact lens as in FIG. 1A, in accordance with some embodiments;

FIGS. 3A to 3C show a miniature light source optically coupled to a micro-optical system comprising a micromirror assembly, in accordance with some embodiments;

FIGS. 11A to 11E show assembly steps and components to place the low-profile Silicon capacitors and the batteries, respectively, on the flexible PCB, in accordance with some embodiments.

DETAILED DESCRIPTION

Figure 3F:
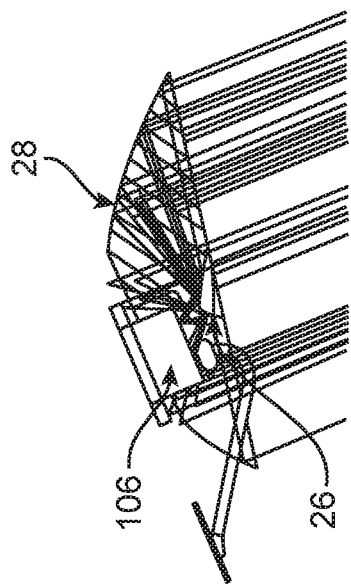
FIGS. 3D to 3F show the ray tracing diagram of the micro-optical system coupled to the light source as in FIGS. 3A to 3C, in accordance with some embodiments.

The following detailed description and provides a better understanding of the features and advantages of the inventions described in the present disclosure in accordance with the embodiments disclosed herein. Although the detailed description includes many specific embodiments, these are provided by way of example only and should not be construed as limiting the scope of the inventions disclosed herein.

FIG. 1A shows an electronic contact lens 100 for one or more of the decreased myopia progression or the reversal of myopia. FIG. 1B shows a contact lens 100 as in FIG. 1A placed on an eye 102. In some embodiments, a soft contact lens comprises a body 104 of soft biocompatible hydrophilic material, embedded with one or more layers of electronic circuitry, and one or more miniature sources of light 106, operable by the electronics provided herein. Each light source 106 is optically coupled with a micro-optic light collection and focusing component, such that an image is formed on or about the retina by each light source 106 and corresponding focusing component. The one or more light sources 106 may comprise a plurality of light sources. The plurality of light sources 106 may be turned on individually or in synchrony. In some embodiments, the one or more light sources 106 can be adjusted in terms of the wavelength (color) of light emitted therefrom.

The electronic contact lens 100 can be configured in many ways to treat myopia of the eye with a plurality of light sources 106. The treatment of myopia may comprise a decreased progression of myopia or a reversal of myopia, for example. In some embodiments, a plurality of projection optics 108 is coupled to the plurality of light sources 106 to project light rays 140 of a plurality of images to one or more locations 142 anterior to the retina 144 to decrease a progression of myopia of the eye. The plurality of projection optics 108 can be arranged to project the plurality of images of the plurality of light sources 106 at a plurality of outer regions of the retina of the eye with an eccentricity within a range from 15 degrees to 30 degrees with respect to a fovea of the eye. In some embodiments, each of said plurality of projection optics 108 is arranged to project an image myopically defocused with respect to a retinal surface, and the amount of said defocus can be within a range from 2.0 D to 5.0 D. In some embodiments, each of said plurality of projection optics 108 is located 1.5 mm to 5.0 mm from a center of said contact lens, and the plurality of projection optics can be located along the circumference of a circle. The contact lens may comprise a central optical zone 110 to provide vision correction when worn, and the central optical zone may correspond to a refraction (eyeglass prescription) of the eye. In some embodiments, the plurality of projection optics 108 comprises a plurality of image forming optics optically coupled to said plurality of light sources to project the plurality of images anterior to the surface of the retina.

The refractive error of the eye treated with the defocused light may comprise one or more of myopia (e.g. nearsightedness) or hyperopia (e.g. farsightedness). In some embodiments, the length of the eye is related to the refractive error of the eye, in which increased axial length corresponds to increased myopia and decreased axial length corresponds to decreased myopia. In some embodiments, increased hyperopia corresponds to decreased axial length of the eye and decreased hyperopia corresponds to increased axial length. By changing the rate of growth of the eye, e.g. increase in axial length, the progression of myopia can be decreased, for example. The choroidal thickness of the eye may also change in response to the defocused light and the change in choroidal thickness can be measured with optical coherence tomography ("OCT"), for example.

In some embodiments, the decreased progression of myopia or reversal of myopia in a patient may be tracked. For example, a measuring device may be used to measure the axial length of the patient's eye before and during treatment. The axial length of the eye may be measured centrally and/or over a range of eccentricates of up to +/−6.0 degrees. For example, the length may be measured at the fovea and over a range of eccentricates of up to +/−6.0 degrees around the fovea. The axial length of the eye can be measured with any suitable commercially available instrument, as will be appreciated by one of ordinary skill in the art of ophthalmology or optometry, for example. The axial length may be measured before providing any of the contact lenses discussed herein and then measured one or more times during treatment with any of the contact lenses discussed herein. By tracking the measurements, a medical professional can make treatment decisions for the patient, such as modifying or concluding treatment, for example.

Referring again to FIG. 1A, the electronic contact lens 100 comprises a contact lens body 104 and associated circuitry and optical components embedded within the contact lens body. The body may have a diameter 130 between about 7 mm and about 28 mm, preferably about 14.3 mm. In some embodiments, the contact lens comprises a flexible printed circuit board 112 ("flex PCB") coupled to one or more light sources 106, one or more capacitors 114, a power source such as one or more batteries 116, an antenna 118, and a processor 120 such as a micro-controller or an application specific integrated circuit ("ASIC"). Each of the one or more light sources 106 may comprise an LED and projection optics 108. Each of the projection optics can be configured in many ways, and may comprise one or more of a lens, a plurality of lenses, a mirror, a plurality of mirrors or a light pipe.

In some embodiments, the contact lens 100 comprises an optical zone 110 to correct far vision of the patient. The flex PCB 112 may comprise an annular portion disposed at least partially around the optical zone 110 and one or more extensions 122 extending to the one or more light sources 106. The optical zone 110 can be sized to the pupil of the eye defined with the iris. The diameter of the optical zone 110 can be any suitable diameter 132, for example between about 2.5 mm and about 10 mm, preferably within a range from about 4 mm to about 8 mm, and more preferably about 5 mm. In some embodiments, the one or more extensions 122 extend at least partially into the optical zone 110 and the one or more light sources 106 are located within the optical zone 110. In some embodiments, the light sources are spaced along a diameter at a distance of between about 1.25 mm and 5 mm apart, preferably about 2.6 mm apart.

FIGS. 2A to 2D show different views of the electronic contact lens 100 as in FIG. 1A. The electronic subsystem may comprise one or more of the following subsystems:

1. A flexible transparent polymeric film that is used as a substrate for mounting the electronic and optical components. The flexible transparent polymeric film may comprise a flexible printed circuit board ("PCB") substrate 112. The flex PCB 112 can be sized and shaped in many ways to couple to the components of the contact lens. For example, the PCB 112 may comprise an outer annular portion 124 defining the traces of the antenna, an inner annular portion 126 outside the optical zone and an extension 122 extending between the inner annular portion 126 and the outer annular portion 124. In some embodiments, the flex PCB comprises a plurality of lateral extension 122 extending from the radially extending extension 123 located between the inner annular portion and the outer annular portion. The plurality of light sources may comprise a plurality of projection units 107 comprising projection optics coupled to LEDs. A plurality of extensions can extend between the light sources and the inner annular portion of the flex PCB. The extensions of the flex PCB may comprise pads for mounting light sources such as LEDs thereon.

2. A plurality of miniaturized light sources 106, mounted away from the center of the contact lens 100, each connected to an electrical conductor of the flex PCB 112 and supported thereon. In some embodiments, each of the plurality of light sources is disposed radially, equidistant from the center of the contact lens with respect to other light sources of the plurality.

3. A processor such as an electronic microcontroller 120 or an application specific integrated circuitry ("ASIC"). The processor 120 can be coupled to the flex PCB 112 and supported thereon as described herein.

4. An antenna 118, disposed on an outer portion of the contact lens 100 toward the outer periphery of the contact lens. The flex PCB may comprise traces of the antenna 118.

5. One or more rechargeable batteries 116. In some embodiments, the recharging power is provided wirelessly, utilizing the antenna 118 to transmit power to the one or more rechargeable batteries. The one or more rechargeable batteries 116 can be coupled to the flex PCB and supported thereon.

6. Capacitors 114, resistors and other electrical components, as appropriate, which can be coupled to the flex PCB and supported thereon.

In some embodiments, the electronic subsystem is embedded into the body of a soft contact lens, designed to provide refractive correction to the wearer. Both surfaces of the electronic contact lens may comprise a soft biocompatible contact lens material such as a hydrogel or a silicone hydrogel copolymer. With this approach, the material to come in contact with the cornea and the eyelids comprises the hydrogel or the silicone hydrogel. These materials can be configured for biocompatibility, non-irritability and wearing comfort, as well as ability to correct refractive error and provide all other benefits to the wearer expected from a conventional soft contact lens, including maintenance of the integrity of the tear film and the corneal epithelium, and transmission of oxygen to the corneal surface.

Referring again to FIG. 2A, one or more portions of the flex PCB 112 can be configured to bend to provide strain relief, in order to shape the flex PCB and components to fit within the contact lens as described herein. In some embodiments, the portions of the flex PCB configured to bend to provide strain relief comprise one or more of: the lateral extensions 122 near the one or more capacitors 114, the lateral extensions 114 near the batteries 116, the radial extension 123 near the antenna 118, or the radial extensions 123 extending from the inner annular portion 126 toward the one or more light sources 106. By appropriately deflecting the components, the flex PCB can be shaped to fit between portions of the contact lens body during manufacturing as described herein.

FIG. 2D also shows that wire-bonding 150 can be used as an electrical connection used to construct the electrical circuit and couple the LED 152 to the circuitry.

In some embodiments, the optical subsystem comprises a plurality of miniaturized light sources, each optically coupled with one or more optical parts of a micro-optics system, such as an optical projection system. The one or more optical parts can be configured to one or more of: collect, substantially collimate or focus light emanating from the light source through the natural pupil of the eye, so that each light source creates a retinal image at an intended angle of eccentricity with respect to the fovea of the eye.

The micro-optic system may comprise one or more of a single lens, a compound lens such as a Gabor lens, a gradient lens, two or more lenses set apart at a specific distance, a mirror, two or more mirrors, a combination of a lens and a mirror, or a combination of a lens and a mirror and another optical element such as a prism. In some embodiments, the overall thickness of the micro-optics and the miniaturized light source does not exceed 250 microns, so that the overall contact lens thickness does not exceed 350 microns, for example.

FIGS. 3A to 3C show a miniature light source optically coupled to a micro-optical system comprising a mirror assembly, in accordance with some embodiments. As shown in FIG. 3A, the micro-mirror assembly may comprise a two-stage lens comprising two reflective mirrors. For example, the micro-mirror assembly may comprise a convex mirror 26 and a concave mirror 28 configured to couple to the light source and direct light to the retina as described herein. Light from the light source can be reflected off the convex mirror and directed to the concave mirror, so as to project light such as substantially collimated light toward the retina. In some embodiments, the optical system is configured to form an image anterior to the retina.

As shown in FIG. 3B, a light source 32 of the contact lens can be configured to form an image anterior to an outer portion of the retina 33 away from the fovea.

FIG. 3C shows a ray tracing simulation of the peripheral retinal image formed by a combination of a light source and an optic as described herein. The angle of the light beam with respect to the fovea of the eye can be configured in many ways, for example based on the placement of the light source on the contact lens. In some embodiments, the light beam is directed to an outer region of the retina located away from the fovea of the eye, for example at an angle of at least about 3 degrees with respect to the fovea although the angle can be greater, e.g. 4 or more degrees. In some embodiments the light beam is directed at an angle of at least about 9 degrees so as to illuminate the retina outside the macula at a peripheral region of the retina.

An image of a light source can be formed on an outer region of the retina, such as the peripheral retina. The peripheral retina comprises a zone of the retinal surface that ranges from eccentricity of 10 degrees to 50 degrees, preferably 15 degrees to 45 degrees with respect to the fovea. The projection optics can be configured to provide a suitable illumination pattern on the eye to one or more of decrease myopia progression or reverse myopia. In some embodiments, the projection optics are configured to form an image anterior to the retina at a location corresponding to an amount of defocus within a range from about 2 to 5 Diopters.

In simulations in accordance with the present disclosure, the anterior chamber depth is assumed to be 4.1 mm, typically between 2.9 mm and 5.0 mm for human subjects, sometimes between about 2 mm and about 8 mm, the axial length has been assumed to be 25.0 mm, and the contact lens 10 is positioned on the cornea. The microscopic light source 30 is placed 1.9 mm away from the center of the contact lens 10, leaving a central optical zone 14 of 3.8 mm in diameter that is clear.

Figure 3D:
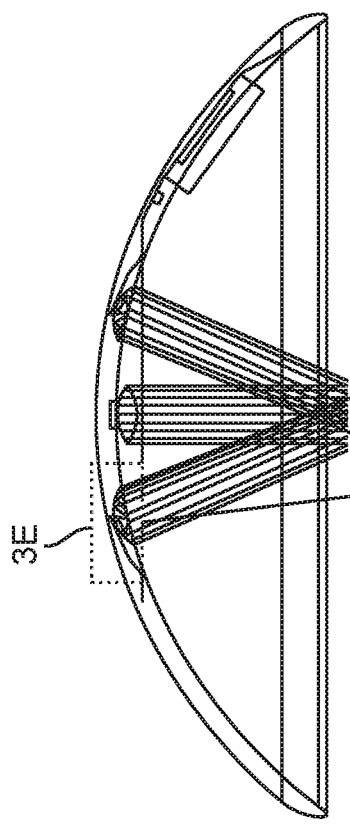
Figure 3E:
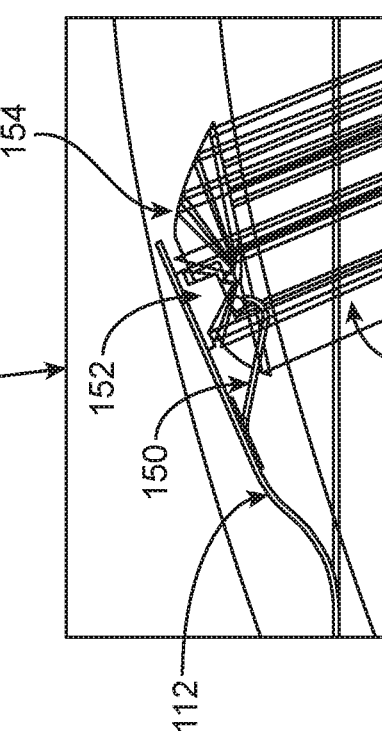

FIGS. 3D to 3F show the ray tracing diagram of the micro-optical system coupled to the light source as in FIGS. 3A to 3C. As shown in FIG. 3D the plurality of substantially collimated light beams 308 projected into the eye by the plurality of light sources 106, 152 substantially overlap anterior to the retina and then separate prior to illuminating the retina. As shown in FIG. 3E, the LED 152 generates light that illuminates the reflective optics 154. The reflective optics 154 are arranged such that substantially collimated light 308 is directed toward the retina. A wire bond 150 can be used to couple the electrical power source from the flex PCB 112 to the LED 152. As shown in FIG. 3F, the projection optics may comprise reflective optics, in which the reflective optics may comprise a concave mirror 28 and a convex mirror 26 as described herein. In some embodiments, the optical system can be configured to form an image anterior to the retina as described herein. While the image can be formed in many ways, in some embodiments, the image formed anterior to the retina comprises image structures, such as structure of the LED light source imaged anterior to the retina.

Figure 4B:
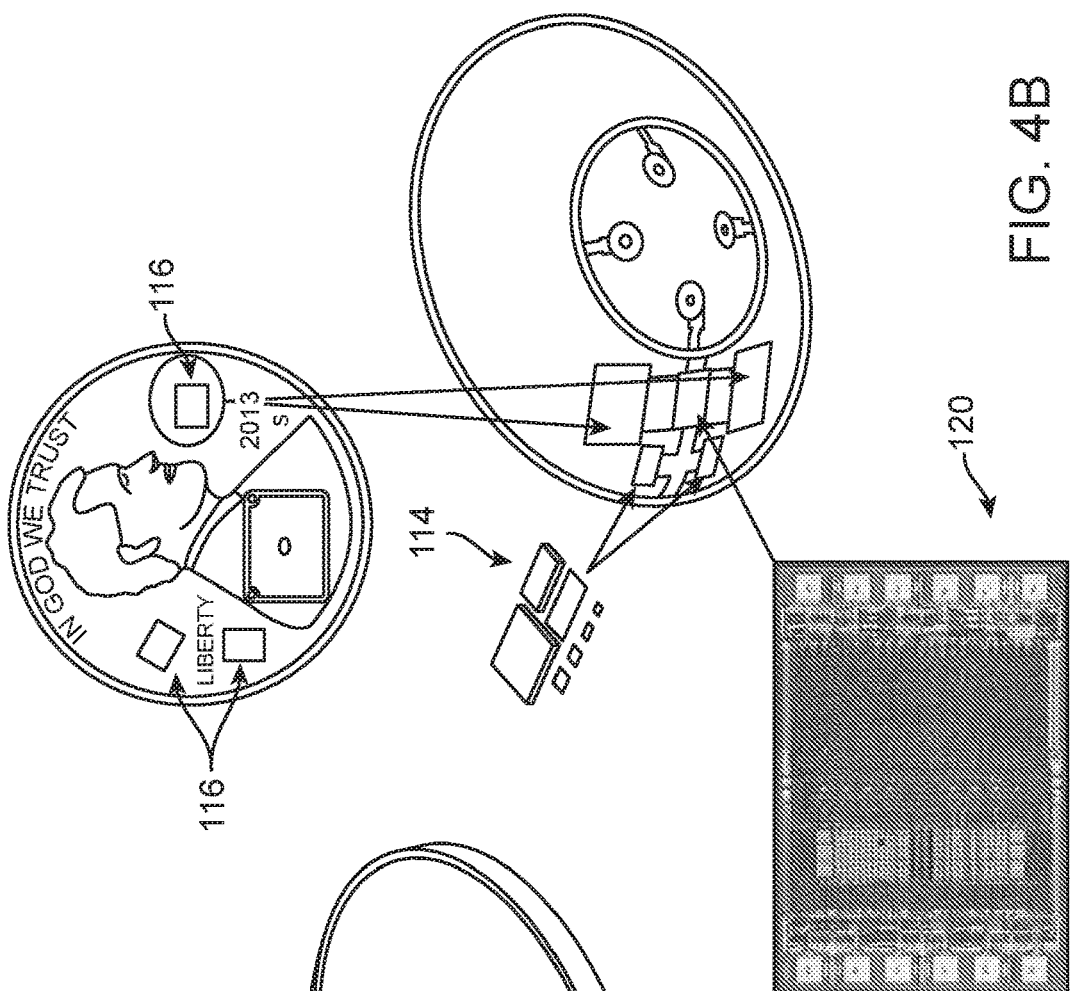
FIGS. 4A and 4B show components of the contact lens as in FIG. 1A and their corresponding dimensions, in accordance with some embodiments.
Figure 4A:
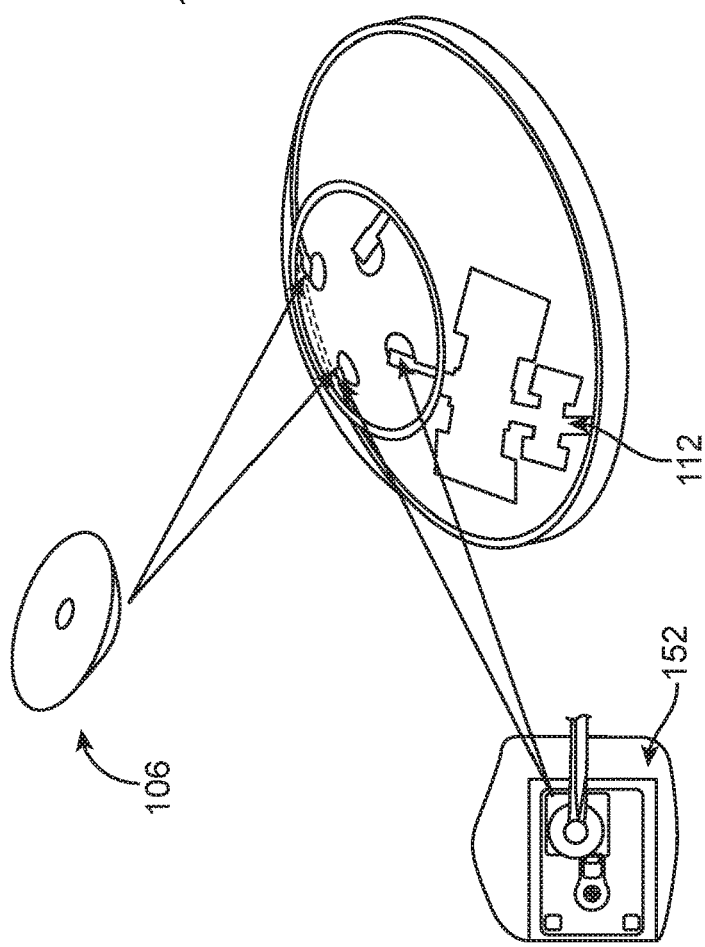

FIGS. 4A and 4B show components of the contact lens as in FIG. 1A and their corresponding dimensions. In FIG. 4B, the relative sizes of these components are shown by comparing their sizes to that of a penny. In some embodiments, one or more components are customized for incorporation into the contact lens in order to reduce their thickness to 100 microns or less. In some embodiments, one or more commercially available optical system components are used. The components may comprise one or more of a plurality of micro-illumination sources, a plurality of micro-optic assemblies optically coupled to the illumination sources, one or more microcontrollers or ASICs, batteries, an RFID module, or an antenna. These components can be obtained from one or more of the following suppliers: Accumold, Chips 4 Light, Cicor, Cymbet, muRata, or Microdul, for example. Additional or fewer components may also be included, depending on the appropriate configuration for a user. For example, some embodiments comprise sensors and RF transceivers to wirelessly transfer sensor data to an external reading unit.

The system components can be configured and dimensioned in many ways. The LEDs 152 can be configured to emit visible light such as red light, for example at about 650 nm. The LEDs may comprise micro LEDs comprising packaging with a maximum distance across of no more than about 0.2 mm, for example no more than about 0.15 mm. In some embodiments, the packaging is between about 0.1 mm and about 0.3 mm on a side, for example, 0.17 mm×0.15 mm. In some embodiments, the packaging is between about 0.05 mm and about 0.2 mm thick, for example, 0.1 mm. Each of the one or more LEDs may comprise a light emitting opening comprising a maximum distance across within a range from about 2 microns to about 40 microns, for example within a range from about 5 microns to about 20 microns, e.g. about 10 microns. Each of the plurality of projection optics may comprise a pair of reflective optics 154 comprising a maximum distance across within a range from about 0.5 to about 2 mm, for example, about 0.1 mm. In some embodiments, each of the plurality of projection optics may comprise a pair of reflective optics 154 comprising a maximum distance across within a range from about 0.5 to 1.5 mm, for example 0.75 to 1.25 mm. Each pair reflective optics may comprise a thickness within a range from about 0.15 mm to about 0.25 mm, for example. In some embodiments, each pair reflective optics may comprise a thickness within a range from about 0.1 mm to about 0.4 mm, for example. In some embodiments, each pair reflective optics may comprise a thickness of about 0.2 mm, and a diameter of 1 mm. The flex PCB 112 may comprise a thickness within a range from about 0.1 microns to about 3 microns, for example within a range from about 0.15 microns to about 0.25 microns. In some embodiments, the flex PCB 112 may comprise a thickness within a range from about 11 microns to about 50 microns, for example about 23 microns. The one or more batteries 116 may comprise solid state batteries having a power storage within a range from 2 to 10 micro amp hours (uAh), for example. The maximum distance across each of the one or more batteries can be within a range from about 1 to 4 mm, for example within a range from about 1 to 3 mm. The one or more batteries may comprise a length within a range from about 1 to 3 mm and a width within a range from about 1 to 3 mm. The thickness of the one or more batteries can be within a range from about 0.05 to about 0.2 mm, for example within a range from about 0.07 to about 0.15 mm. The batteries 116 may be about 2.25 mm wide, about 1.7 mm long, and about 0.1 mm thick. The one or more capacitors may comprise a capacitance within a range from about 50 pF to about 20 nF, and the one or more capacitors may comprise a plurality of capacitors each with a different capacitance. In some embodiments, one or more capacitors may comprise a capacitance within a range from about 200 pF to about 5 nF, for example, 100 pF and 10 nF. The one or more capacitors may comprise a maximum distance across within a range from about 1 to 3 mm, a corresponding length within a range from about 0.5 to 1.5 mm, and a corresponding width within a range from about 0.4 to 1.5 mm. The one or more capacitors 114 may comprise width between 0.5 and 3 mm, for example, 1.2 mm and a length of between 0.3 mm and 1.5 mm, for example, 0.7 mm. The thickness of the one or more capacitors can be within a range from about 0.05 to about 0.15 mm. In some embodiments, the thickness of the one or more capacitors can be within a range from about 0.05 to about 0.2 mm, for example, 0.1 mm. The processor such as a micro controller or ASIC may comprise a maximum distance across within a range from about 1.0 to about 2.5 mm, a length within a range from about 0.5 to 1.5 mm and a thickness within a range from about 0.05 to 0.15 mm. In some embodiments, the processor such as a micro controller or ASIC may comprise a width within a range from about 0.5 to about 1.6 mm, for example, about 1.07 mm, a length within a range from about 0.7 mm to about 3.0 mm, for example, 1.56 and a thickness within a range from about 0.05 to 0.2 mm, for example, about 0.1 mm. The antenna may comprise a number of turns within a range from about 2 to 10, for example 4 to 8 turns, and the antenna may comprise traces of conductor material on the flex PCB. Each of these components can be mounted on the flex PCB.

FIGS. 5A to 5D show the configurations and dimensions of components of the electronic contact lens as they relate to the overall thickness of the contact lens.

Figure 5A:
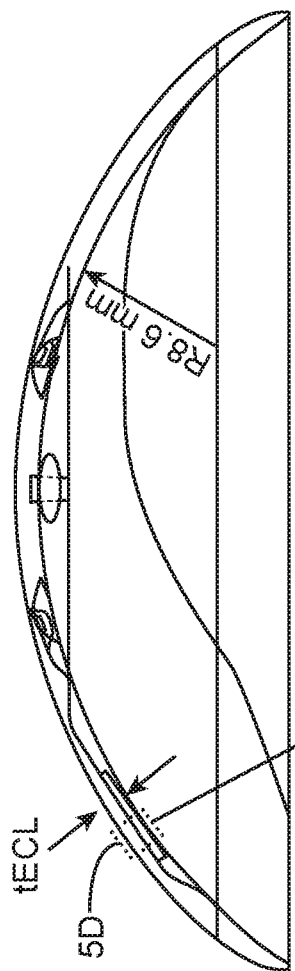
FIGS. 5A to 5D show the configurations and dimensions of components of the electronic contact lens as they relate to the overall thickness of the contact lens, in accordance with some embodiments.
Figure 5B:
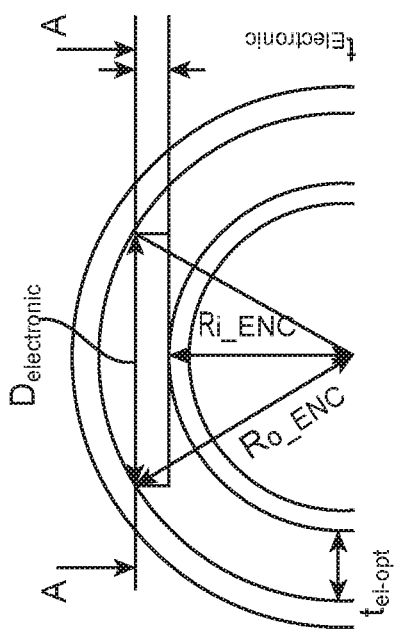

FIG. 5A shows the relationship between the dimensions of an electronic component and the thickness of the contact lens for a substantially rectangular shaped component extending between curved anterior and posterior surfaces of the contact lens. Although the flex PCB can bend, at least some of the electronic components may not bend readily in some embodiments. As shown, the electronic component comprises a thickness "Telectronic" and extends a maximum distance "Delectronic" as shown in FIGS. 5A and 5B, respectively. These dimensions of the electronic component can be used to determine an outer radial dimension of the component "Ro_enc" and an inner radial dimension "Ri_enc" of the electronic component when placed in a contact lens. The difference between these two radial dimensions defines a thickness "Tel-opt" corresponding to the effective thickness of the component when embedded in the contact lens. In some embodiments, this thickness is no more than about 240 microns. In some embodiments, this thickness is no more than about 480 microns.

Figure 5C:
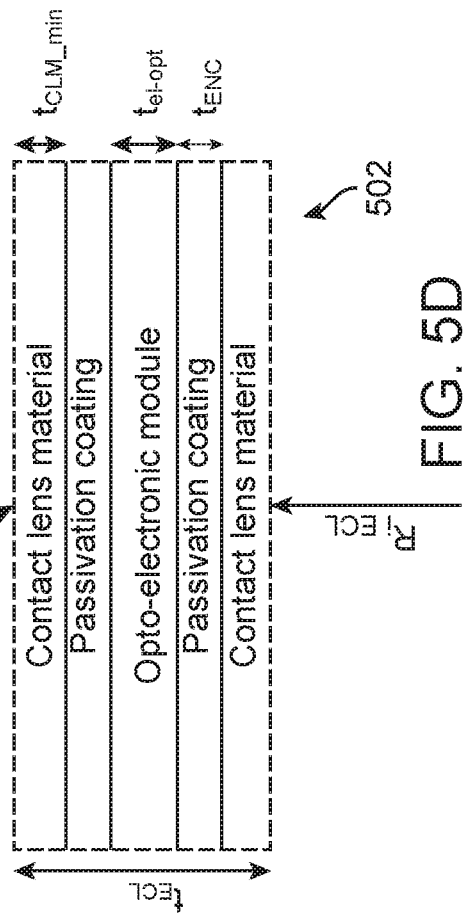
Figure 5D:
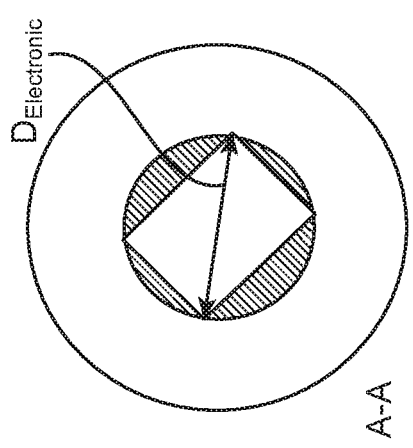

In some embodiments, the thickness of electronic contact lens "Ted" comprises no more than about 350 microns as shown in FIG. 5C. In some embodiments, the thickness of electronic contact lens "Ted" comprises no more than about 700 microns. The posterior surface 502 of the contact lens may comprise a base curvature corresponding to a radius of curvature. The radius of curvature can be dimensioned to fit an eye of the user and can be within a range from, for example about 7.5 to about 9 mm, for example 8.6 mm.

In some embodiments, the thickness of the electronic contact lens is within a range from 50 microns to about 900 microns or 100 to 450 microns (micro-meters) and can be within a range from 125 to 350 microns. An exemplary allocation of thickness contributions is shown in FIG. 5 D. The thickness of the flexible PCB substrate can be within a range from 10 to 50 microns, for example within a range from 15 to 25 microns. Exemplary dimensions of the ASIC are 1.6×1.1 mm with a diagonal dimension of 2 mm as shown in FIG. 5B. The bonding thickness can be within a range from about 10 to 30 microns, for example about 20 microns. The thickness of the silicon ASIC chip can be 100 microns approximately, with a resulting thickness of 200 microns. Exemplary dimensions of the batteries are 2.25× 1.7 mm, with a diagonal length of 2.8 mm. The bonding thickness can be approximately 10 microns. Since the batteries are can be substantially planar, their thickness can be 100 microns or less, in order to satisfy the overall design constraint of thickness (350 microns), in accordance with some embodiments. There can be a trade-off between the area of the batteries and their thickness. For example, if the thickness of the batteries is 120 microns, their area can be reduced to 1.85 mm×1.7 mm, in order to reduce their contribution the overall thickness and to lens sag.

In some embodiments, the thickness of the contact lens material "$t_{CLM}$" is between about 25 microns and about 100 microns, for example, 50 microns. In some embodiments, the thickness of the passivation coating "$t_{ENC}$" is between 0.2 and 10 microns, for example, 5 microns. In some embodiments, the thickness of the opto-electronic module "$t_{el\text{-}opt}$" is between 50 microns and 500 microns, for example less than 240 microns. In some embodiments, the thickness of the electronic contact lens "$t_{ECL}$" is between 150 microns and 700 microns, for example, less than 350 microns.

Figure 6:
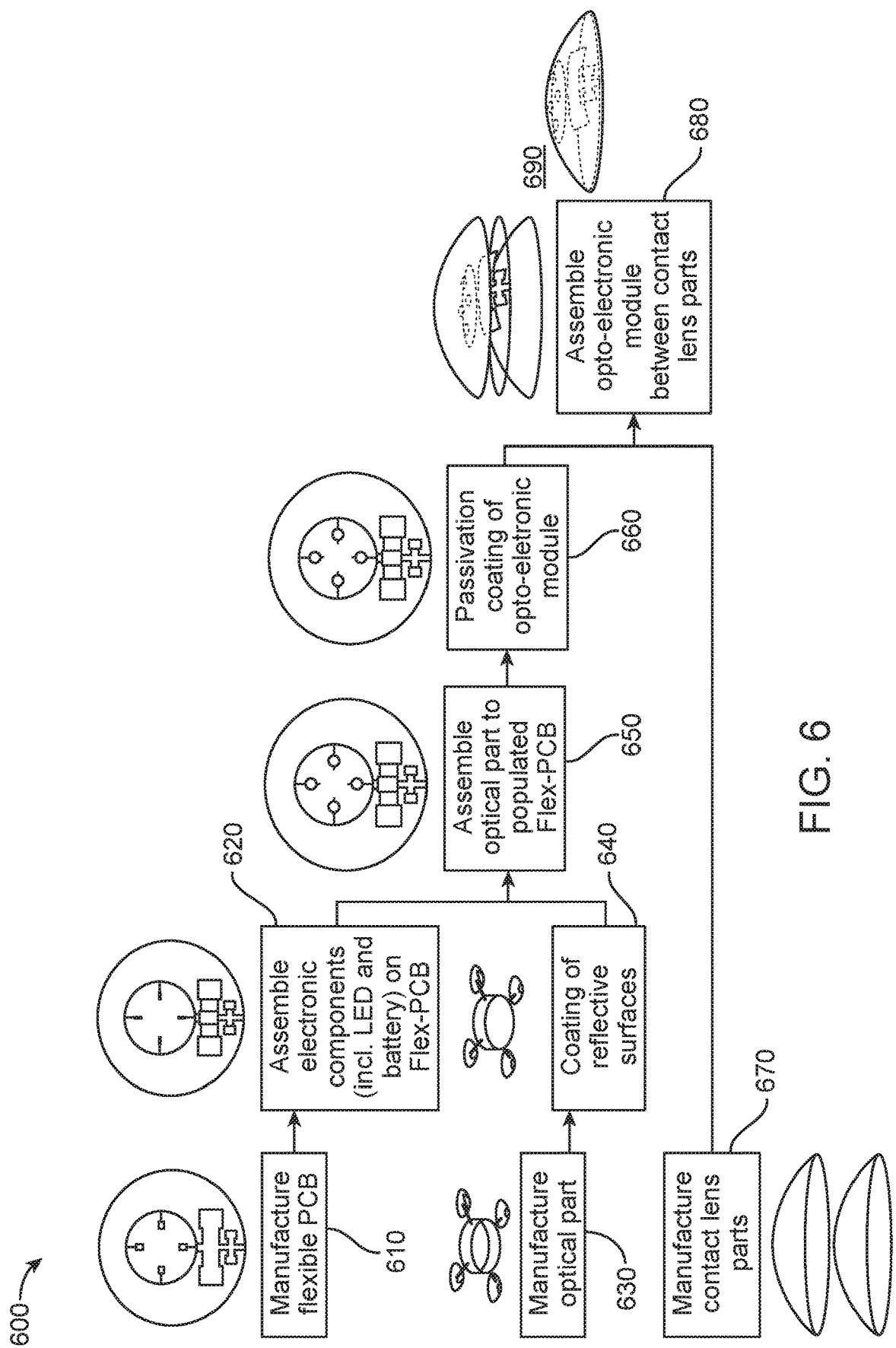
FIG. 6 shows a method of manufacturing a contact lens, in accordance with some embodiments.

FIG. 6 shows a method of manufacturing a contact lens. The contact lens can be manufactured with steps in accordance with the flow of the assembly process of the electronic and optical subsystems and their integration into the contact lens. At a step 610 a flexible PCB is manufactured. The flex PCB may comprise multilayer of PCB film. In some embodiments, the PCB film is made of a flexible polymer, such as a high performance partially crystalline thermoplastic with low dielectric constant that is relatively independent of frequency of the electromagnetic radiation. The thermoplastic may comprise one or more of a polyimide, a polysulfone, a polyethersulfone, a polyetherimide, or a polyether. In some embodiments, the thermoplastic comprises a polyimide such as Kapton®, poly (4,4'-oxydiphenylene-pyromellitimide) supplied by Du Pont and Mitsui chemicals. In some embodiments, one or more layers of the PCB film is preferably manufactured by spin casting a chemical precursor of the imide, a polyamic acid which is liquid at room temperature. The polyamic acid can be mixed with a solvent, then spun on a silicon or glass wafer at high speed (100-10,000 rpm) to form a uniform film. The wafer bearing this polyamic acid film is then heated under nitrogen for several hours ramping temperature from 40-150 Degrees C. Films may be flat or microtextured. A plurality of layers, e.g. multiple layers, may be bonded to create a multilayer film substrate. In some embodiments, the electrical wiring and the antenna are then assembled on the film by one or more of chemical vapor deposition (CVD), microlithography or D printing. One or more metals or non-metals may be used to form the wiring and the antenna. While several non-metal material may be used, in some embodiments, the non-metal comprises carbon. In some embodiments, the metal comprises being Gold with a thin layer of Titanium (typically 5-10 Angstroms), acting as an adhesion enhancer.

At a step 620, components are placed on the flex PCB and coupled thereto. In some embodiments, the components are placed on and coupled to the flex PCB with the following sequence:

1. Anisotropically Conductive Adhesive ("ACA")
2 capacitors
ASIC
2. Isotropically Conductive Adhesive ("ICA")
2 batteries
4 LEDs (bottom contact)
3. Wire Bonding
4 LEDs (top contact)

At a step 630 an optical part is manufactured. The optical part may comprise a plurality of optics such as a projection optics as described herein and a sacrificial support to be removed after the projection optics have been coupled to the LED light sources. The optical part may comprise 4 reflective optics, each comprising a convex and a concave mirror. The sacrificial support may comprise center structure for alignment. Each of the plurality of projection optics can be coupled to an arm of the support in order to place the projection optics accurately on the LEDs coupled to the PCB as described herein, for example with reference to FIGS. 10A and 10B.

At a step 640 a coating is applied to the reflective surfaces of the optical projection optics. The coating may comprise a reflective coating.

At a step 650 the projection optics are coupled to the flex PCB. Once each of the plurality reflective optics has been adhered to the LEDs with an adhesive, e.g. glued, the arms can be separated from the support, and the central support structure removed. With the central support removed, the electronics module comprises the LEDs, the projection optics, the processor, the battery and the capacitor mounted on the flex PCB, and a clear aperture extends across the central portion of the electronics module. The clear aperture is sized and shaped to provide the optical zone to allow correction of the refractive error of the eye. In some embodiments, the clear aperture comprises a boundary at least partially defined with the one or more extensions of the flex PCB extending to the projection optics and LEDs.

At a step 660, a passivation coating is applied to the optoelectronic module.

At a step 670, components of the contact lens body are manufactured.

At a step 680, the opto-electronic module prepared at step 660 is placed between the first and second lens components prepared at step 670. At a step 690, the adhesive is cured and the lens hydrated.

Although FIG. 6 shows a method of manufacturing an electronic contact lens to treat myopia in accordance with some embodiments, a person of ordinary skill in the art will recognize many adaptations and variations. For example, the steps can be performed in any order. Some of the steps can be repeated and some of the steps removed.

Referring again to FIG. 6, and the contact lens parts manufactured at step 670, the upper component layer may comprise a meniscus shape, the convex surface of which becomes the anterior surface of the contact lens when worn. The central thickness of this meniscus can be within a range from about 30 to about 70 microns, for example from about 40 to 60 microns, e.g. about 50 microns. In some embodiments, this layer is designed to have no optical power when free standing in air, for example.

In some embodiments, the inner layer (e.g. central layer) of the contact lens comprise comprises the flexible PCB substrate with mounted electro-optical components.

In some embodiments, the lower component layer comprises a meniscus shape, the concave surface of which contacts the cornea and is located posteriorly relative to the anterior surface of the lens.

Each of the upper and lower layers comprises biocompatible hydrophilic polymer approved for use in contact lenses. The flexible PCB substrate is placed on the concave surface of the third layer, a small volume (approximately 1 microliter) of a transparent biocompatible liquid photocurable adhesive is added to wet the surface of the flexible PCB substrate and form an interface between the upper and lower layers of the composite contact lens (FIG. 6). In some embodiments, the adhesive material comprises the monomer precursor of the polymer comprising the upper and lower layers of the contact lens assembly, ensuring that the refractive index (RI) of the interface layer is substantially identical to the RI of the upper and lower layers. In some embodiments, the upper layer is then positioned accurately, centered so that the optical centers of the upper and lower layers are aligned with the optic axis of the lens, then the assembly is exposed to UV or short wave-length visible radiation in order to cure the adhesive layer.

In some embodiments, the components of contact lens body comprise a first lens component and a second lens component. The first lens component can be placed on a first side of the electronics module and the second lens component placed on a second side of the electronics module, and an adhesive used to couple the first component to the second component with the opto-electronic module positioned therebetween. The first lens component may comprise a base lens component to be placed against the cornea of the eye and the second lens component may comprises an anterior lens component oriented away from the eye. As illustrated in FIG. 6, the lower lens component comprises the posterior lens component and the upper lens component comprises the anterior lens component.

In some embodiments, two approximately half lens components comprise different biocompatible approved materials. Each of these components may comprise a hydrophilic material with substantially similar water uptake at equilibrium and different refractive indices at equilibrium. The difference in the refractive indices of the two components can be within a range from about 0.05 to about 0.15, for example within a range from about 0.07 to about 0.12. In some embodiments, the refractive power of the lens is provided in the posterior component with a layer that has the higher refractive index. Although reference is made to a lower layer as shown in the drawing, this layer may comprise a posterior portion of the lens when placed in the eye. One or ordinary skill in the art will recognized that the orientation of the lenses can be changed. Alternatively, the refractive power of the lens can be provided in the anterior portion of the lens comprising upper layer as illustrated. These configurations can provide a space of non-uniform thickness between the two approximately half lenses, which are shaped to receive and hold the electronic module as described herein. In some embodiments, this space is filled with a transparent adhesive. In some embodiments, the refractive index of the adhesive is between the refractive indices of the two lens portions, e.g. approximately half lens portions. In some embodiments, the adhesive comprises a refractive index corresponding to a geometric mean of the first and second components of the lens body. The adhesive may comprise a photocurable adhesive.

The first lens component may comprise a base lens component to be placed against the cornea of the eye and the second lens component may comprises an anterior lens component oriented away from the eye. In some embodiments, the first component comprises a base lens such that the refractive error to be corrected by the base lens is placed in the contact lens layer below the electronic layer. This design approach can allow the projected image to be further refracted according to the baseline refraction of the subject. The projection optics such as the micromirror assembly can be configured to provide a specified magnitude of myopic defocus in accordance with the optical properties of the base lens component. The amount of myopic defocus can be within a range from about 2 Diopters ("D") to about 5 D, for example.

The components of the lens body can be configured in many ways and with parameters appropriate to correct the refractive error of the wearer and provide appropriate illumination to the retina. For example, the refractive index of the top (anterior) component layer can be within a range from about 1.40 to about 1.46, for example within a range from about 1.42 to about 1.44, e.g. 1.43. The bottom (base lens) component layer may comprise a refractive index within a range from about 1.48 to about 1.54, for example within a range from 1.50 to 1.52, e.g. about 1.51. The adhesive may comprise an intermediate refractive index within a range from about 1.42 to about 1.48, for example within a range from about 1.44 to about 1.46, e.g. about 1.45. The above ranges illustrative and other embodiments can use different ranges. Also, the above ranges can be reversed for the anterior and posterior layers, e.g. anterior component layer comprises an index within a range from 1.48 to 1.54 and the posterior component layer comprises an index within a range from 1.40 to 1.46, for example.

The water uptake of the first component and the second component can be substantially similar (e.g. upon fully hydration) and within about 2% of each other, for example within about 1% of each other. For example, the water uptake of both components can be within a range from about 35% to about 41%, for example from about 37% to about 39%, e.g. about 38%. The adhesive layer may comprise similar values and ranges, for example within a range from about 35% to about 41%, for example from about 37% to about 39%, e.g. about 38%.

The thickness of the top (anterior) layer can be about 50 microns and the bottom layer 120 microns, for example.

The baseline refraction of the wearer can be within a range from about −2 D to −8 D, for example within a range from −2 D to −6 D and can be within a range from −3.0 to −4.0 D.

The gap extending between the two components may comprise an edge distance within a range from about 240 to about 340 microns, for example from about 260 to about 320 microns, and can be within a range from about 280 to about 300 microns, e.g. about 290 microns. The gap may comprise a central thickness within a range from about 190 microns to about 290 microns, for example within a range from about 210 microns to about 270 microns and can be within a range from about 230 microns to about 250 microns, e.g. about 240 microns.

Figure 7:
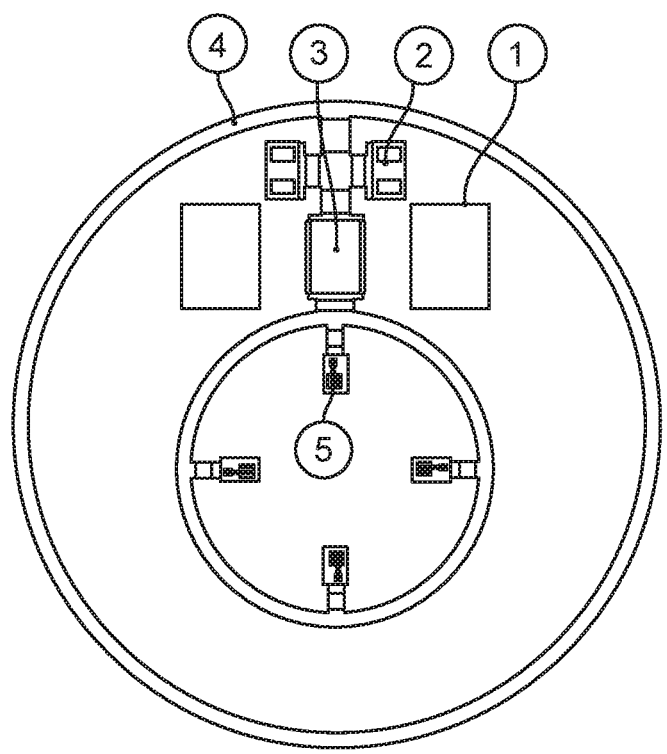
FIG. 7 shows components of the contact lens as in FIGS. 2A to 2D and the corresponding locations.

FIG. 7 shows components of the contact lens as in FIGS. 2A to 2D and the corresponding locations. Examples of suppliers of some of these components include: Cymbet, Murata, Microdul, Cicor and Chips4Light. The battery can be placed a position 1, the capacitors at position 2, the processor such as the ASIC at position 3, custom LED at position 6. In some embodiments, the flex PCB extends under each of these components so as to support these components.

Table 1 shows items, description, quantity and remarks regarding components of contact lens as in FIGS. 2A to 2D.

TABLE 1

| Item | Description | Quantity | Remarks |
|---|---|---|---|
| 1 | Battery | 1 to 4, for example 2 | Thinned to between 100 microns and 200 microns, for example, 100 microns |
| 2 | Low Profile Silicon Capacitor | 1 to 4, for example 2 | Capacitor |
| 3 | ASIC | 1 to 3, for example 1 | |
| 4 | Flex PCB | 1 to 4, for example 1 | Liquid Polyimide |
| 5 | Custom LED | 2 to 12, for example 4 | Custom |

Figure 8A:
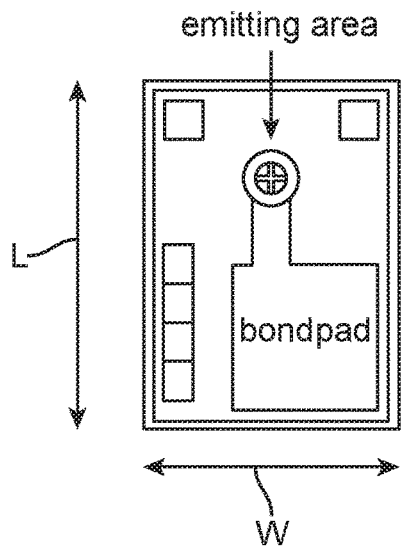
FIGS. 8A to 8C show structural aspects and dimensions of a light source such as a light emitting diode of the electronic contact lens, in accordance with some embodiments.
Figure 8B:
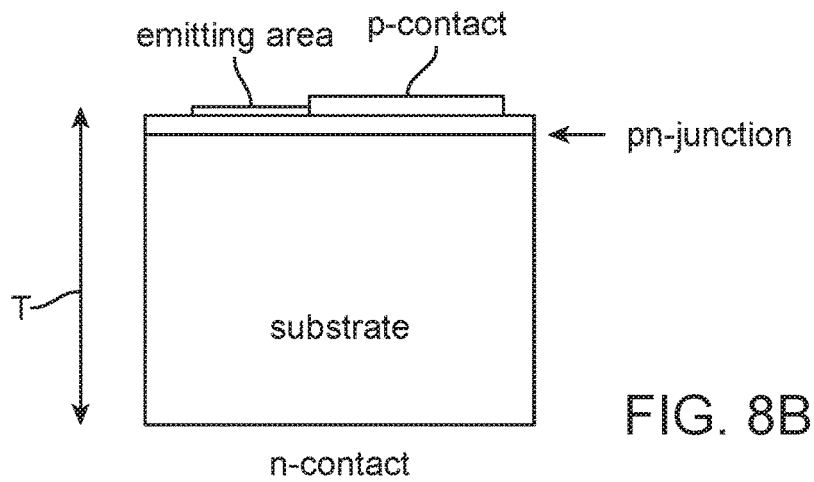
Figure 8C:
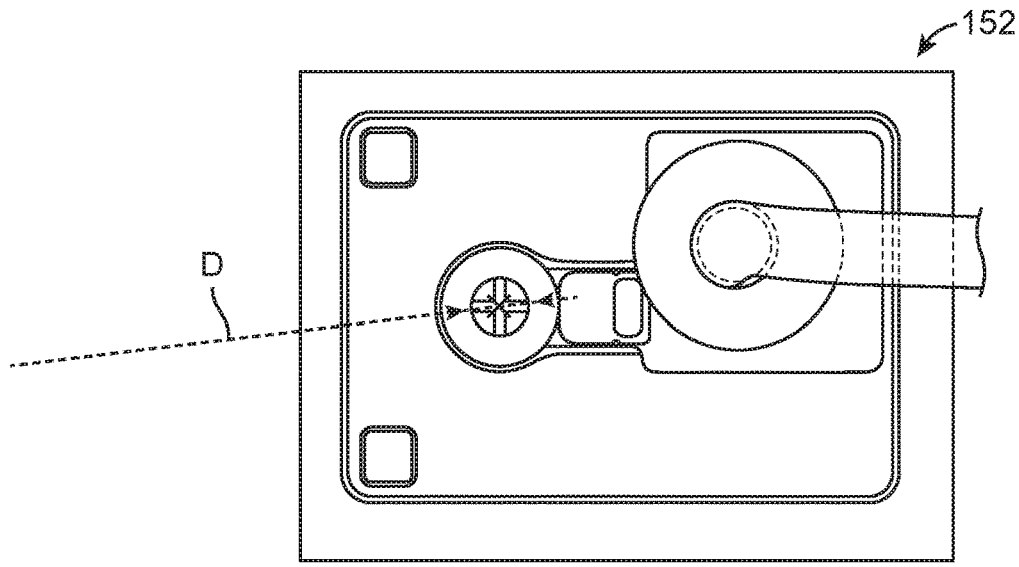

FIGS. 8A to 8C show structural aspects and dimensions of a light source 106 such as a light emitting diode of the electronic contact lens. Many types of light emitting diodes may be used, among them organic light emitting diodes (OLED), transparent organic light emitting diodes (TOLED), active matrix or passive matrix OLEDs, or inorganic light emitting diodes (i-LEDs).

With reference to FIG. 8A, each of the one or more LEDs may comprise a length "L" and a width "W" extending along the flex PCB. The length can be within a range from about 160 to about 280 microns, for example within a range from about 180 to 260 microns. In some embodiments, the length can be within a range from about 100 to about 500 microns, for example about 220 microns. In some embodiments, the width can be within a range from about 50 to about 300 microns, for example about 160 microns.

With reference to FIG. 8B, each of the one or more LEDs may comprise a thickness "T" within a range from about 100 to about 400 microns, for example within a range from 140 to about 260 microns, for example within a range from about 160 to about 240 microns, and the range can be from 180 to 220 microns. In some embodiments, the thickness is about 200 microns. An exemplary set of light emitting diodes can be obtained from Chips4Light, a supplier located in Etterzhausen, Germany. In some embodiments, the overall area is 220 (±40)×160 (±40) microns, and that may be scaled down to 170×150 microns, for example.

The thickness can be 200±20 microns, scalable down to 50-100 microns, for example.

With reference to FIG. 8C, a diameter "D" of the emitting portion of the light sources 106 may be between about 10 microns and about 40 microns, for example, about 19.7 microns.

TABLE 2

Methods of assembly of components on the flexible PCB substrate and various options, in accordance with some embodiments.

| Bonding Technologies Component | Reflow soldering | ACA (anisotropically conductive adhesive) | ICA (isotropically conductive adhesive) | Thermocompression bonding | Wire Bonding | Aerosol Printing |
|---|---|---|---|---|---|---|
| LED bottom contact | Optional | Optional | Yes | Optional | No | No |
| LED top contact | No | No | No | No | Yes | Maybe |
| Battery (CBC005, Cymbet) | Optional | Yes | Yes | Optional | Yes | Maybe |
| ASIC | Yes | Yes | No | Yes | Yes | Maybe |
| Capacitor | Yes | Optional | Optional | Optional | Yes | Maybe |

The above table illustrates configurations in accordance with some embodiments, and a person of ordinary skill in the art will recognize many adaptations and variations, and some of these can be removed or replaced.

The bonding area in the bottom contact (cathode) of the LED can be made of a gold alloy. In some embodiments, the preferred assembly technology is epoxy bonding.

In some embodiments, the top contact (anode) has a bonding area is made of gold and has a bonding area of 80×80±10 microns. In some embodiments, the preferred assembly technology in this case is gold wire bonding (reverse ball-wedge). Another embodiment uses aerosol printing potentially leading to a lower thickness than wire bonding.

Table 3 shows thicknesses and widths of the layers of a flexible PCB substrate.

TABLE 3

| | Thickness | Width |
|---|---|---|
| Three Layers liquid Polyimide | | |
| PI-2611 | 3 μm to 12 μm ± 2 μm, for example, 6 μm ± 2 μm | ≥conductor, ≥15 μm preferably ≥30 μm |
| Pull-back (distance conductor to substrate edge) | | ≥25 μm ≥ 50 μm, preferably 75 μm, more preferably 100 μm |
| Two Metallization Layers | | |
| Ti (Adhesion Layer) | 0.02 μm to 0.1 μm, preferably 0.05 μm | |
| Au (Conductor Layer) | 1 to 4 μm, preferably ≥ 2 μm, for example 2.5 μm ± 30% | ≥10 μm, ≥20 ± 5 μm, preferably >30 μm |

Figure 9A:
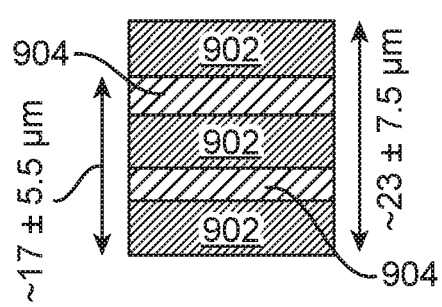
FIGS. 9A and 9B show dimensions of a flexible printed circuit board substrate, in accordance with some embodiments.
Figure 9B:
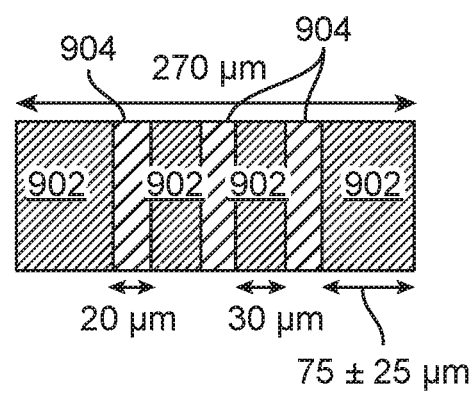

FIGS. 9A and 9B show dimensions of a flexible printed circuit board substrate. The flexible PCB may comprise a plurality of layers and suitable materials and dimensions for use with the electronic contact lens as disclosed herein. In some embodiments, the flexible PCB substrate comprises a plurality of layers of dielectric material 902 such as polyimide material (e.g. Kapton®) and a plurality of layers of a conductor material 904, such as a metallic material. The plurality of dielectric layers 902 may each comprise a thickness within a range from about 3 microns to about 9 microns, for example about 6 microns. The plurality of conductor layers 904 may comprise any suitable metal and can be formed with metallized by deposition of a gold deposit with Titanium as adhesion enhancer, for example. The plurality of conductive layers 904 may be between about 0.1 and about 0.5 microns thick for example, about 2.5 microns.

The flexible PCB substrate may comprise these dimensions at some of the locations of the flex PCB in order to provide strain relief to the flex PCB. For example, the flex PCB may comprise bending zones of the flex PCB substrate. The bending zones of the flex PCB may comprise one or more of the following portions: a portion of the extension located between the antenna and the ASIC, a portion of the extension between the ASIC and the inner annular portion of the flex PCB, a portion of the one or more of the lateral extensions of the flex PCB extending to toward the batteries and the capacitors, or the extensions extending from the inner annular portion of the flex PCB toward the one or more light sources. In some embodiments, the flex PCB comprises three or more polyimide layers and two or more metallization layers, with the two or more metallization layers between the three or more polyimide layers, as shown in FIG. 9A.

FIG. 9B shows a top view of an example arrangement of dielectric layers 902 and conductor layers 904 for use in a flex PCB or antenna 118 of the outer annular portion 124 or the inner annular portion 126 for connection to the light sources 106, for example. The thickness of the outer dielectric layers may be 75 microns±25 microns. In some embodiments, the thickness of the outer dielectric layers may be between about 30 microns to about 150 microns. The thickness of the inner dielectric layers may be between about 15 microns to about 60 microns, for example, about 30 microns. The thickness of the conductive layers may be between about 10 microns to about 40 microns, for example, about 20 microns.

The arrangement of dielectric layers 902 and conductor layers 904 of FIGS. 9A and 9B may be used alternatively or in combination to form structures such as flex PCBs or antennas with additional layers and traces.

Figure 10A:
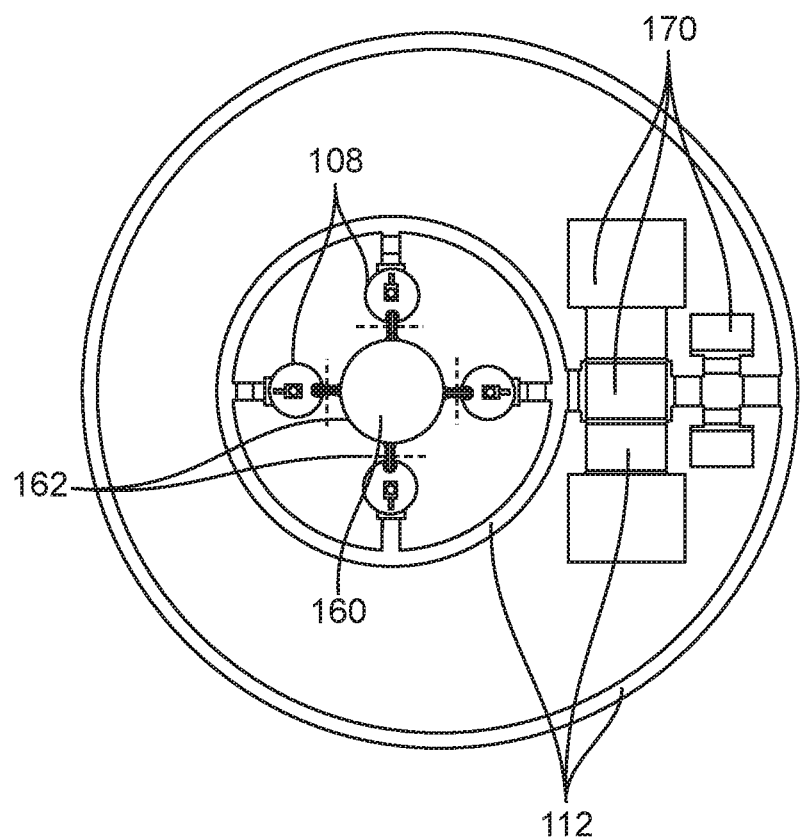
FIGS. 10A and 10B show the assembly process for placing the optical components on the flex PCB substrate, in accordance with some embodiments.
Figure 10B:
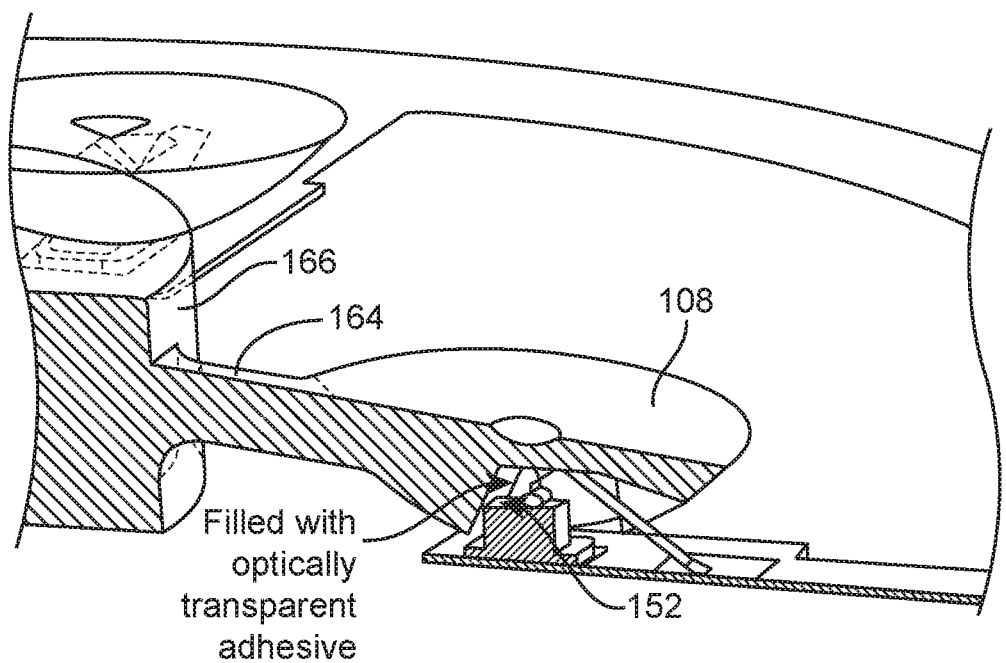

FIGS. 10A and 10B show the assembly process for placing the optical components on the flex PCB substrate and corresponding components 170. The one or more projection optics is aligned with the LED and an adhesive applied between the LED and the one or more projection optics.

In some embodiments, the optical part placed on the flex PCB 112 comprises a sacrificial support structure 160 coupled to projection optics 108 as described herein. The sacrificial support 160 may comprise a plurality of arms 164 extending to the plurality of projection optics 108 to place the projection optics on the plurality of LEDs that have been placed on the flex PCB 112. Once the plurality of projection optics has been adhered to the plurality of LEDs at a plurality of locations, the sacrificial support can be separated from the plurality of projection optics as shown with the dashed lines 162. The sacrificial support structure 160 may comprise a central cylindrical portion 166 and a plurality of arms 164. The central cylinder and the plurality of arms can serve as manipulation interface during assembly by providing one or more of the following:

a dedicated mechanical interface with the pick-and-place machine assembly of the plurality of projection optics together, e.g. all 4 reflective optics at once a precise placement reference, i.e. the distance between the LED and the reflective optics is controlled by the contact between the center structure and the PCB substrate The material of the optical part may comprise one or more of poly methyl methacrylate ("PMMA"), polystyrene or polycarbonate.

One or more steps of this method can be combined with the method of FIG. 6. These steps include one or more of the following:

1. Dispense adhesive on LEDs
Optically transparent adhesive
to fix optical part on light source
to mechanically protect wire-bond
to fill spacing between light source and optical part
to protect LED from liquid (e.g. when removing Flex-PCB from rigid carrier)
may have substantially the same refractive index as optical part (and contact lens)
biocompatible in some embodiments
2. Position optical module on PCB
Optical module comprises of 4 substantially similar and symmetrically placed mirror-optics
Alignment of the 4 mirror-optics to the 4 LEDs without damaging the wire-bonds
Vertical position might be given by central block of optical module
3. Cut the mirror-optics apart FIGS. 11A to 11D shows assembly steps and components to place the low-profile Silicon capacitors 114 and the batteries 116, respectively, on the flexible PCB 112. Each of these components is identified with a circle showing the location of placement on the flexible PCB. As shown in FIG. 11A, in some embodiments the components of the capacitor 114 the following dimensions: a dimension A corresponding to a length of the capacitor case; a dimension B corresponding to a width of the capacitor case a dimension C corresponding to a width of the pads of the capacitor, a dimension D corresponding to an inner distance between the pads of the capacitor, a dimension E corresponding to a first inset of each of the pads from an edge the capacitor, a dimension F corresponding to a length of the pads of the capacitor, and a dimension G corresponding to a second inset of pads of the capacitor from the edge of the case. Dimension A may be between about 0.4 mm and about 4 mm. Dimension B may be between about 0.3 mm and about 2.5 mm. Dimension C may be between about 0.07 mm and about 1 mm. Dimension D may be between about 0.15 mm and about 2 mm. Dimension E may be between about 0.05 mm and about 0.2 mm. Dimension F may be between about 0.2 mm and about 2.0 mm. Dimension A may be between about 0.05 mm and about 0.2 mm. The dimensions are illustrated in FIG. 11B. Although reference is made to capacitors with a case size of 1.2 mm by 1.2 mm, smaller or larger capacitors can be used.

The placement of the capacitors on the flexible PCB is identified with a circle in FIG. 11C.

Thickness of the capacitors can be within a range from about 60 to 100 microns, for example within a range from about 80 to 100 microns, e.g. about 80 microns. Their dimensions along the flex PCB can be about 1.2×0.7 mm. Two capacitors can be used, one in parallel to antenna, capacitance of about 100 pF, and one in parallel to the battery with a capacitance of about 10 nF. In some embodiments, finishing surfaces of the capacitors comprise lead-free Ni/Au (generally 5 micron nickel and 0.2 micron gold) compatible with wire-bonding or automated soldering technologies. In some embodiments, aluminum pads are used. The assembly process can use a conventional reflow soldering technique. Other processes may also be used, such as solder jetting, or pre-bumped capacitors may be used.

The steps for coupling the capacitors to the PCB may comprise one or more of the following:

Cut the bridges along the red line
With laser (low efficiency if part is transparent)
With waterjet
Remove Flex-PCB from rigid carrier
With water, may be accelerated with ultrasound FIG. 11B shows the assembly process for the one or more batteries, utilizing semi-custom rechargeable Li ion batteries with solid state electrolyte supplied by Cymbet. Battery dimensions were 2.25 mm×1.7 mm×0.2 mm, that may be further thinned down to 2.25 mm×1.7 mm×0.1 mm. Bond pad area in these batteries can be 100 microns×100 microns. Bond pad material comprise 2 micron AlSiCu on Ni/AlSiCu base that forms a non-conductive aluminum oxide layer when exposed to air. Possible alternatives include nickel deposition and etch process, ending with gold bumps, of pitch 1.85 mm.

Number of contacts: 2
Assembly technology: standard: gold wire bonding
ICA (same process as for LED)

These batteries can be partially protected from damage caused by high humidity, before assembly. They can be coated with a conformal hermetic seal over and around the battery structure. Direct contact with DI or distilled water during assembly can be permitted, for example when the cell has not been charged.

Figures 12A, 12B, 12C:
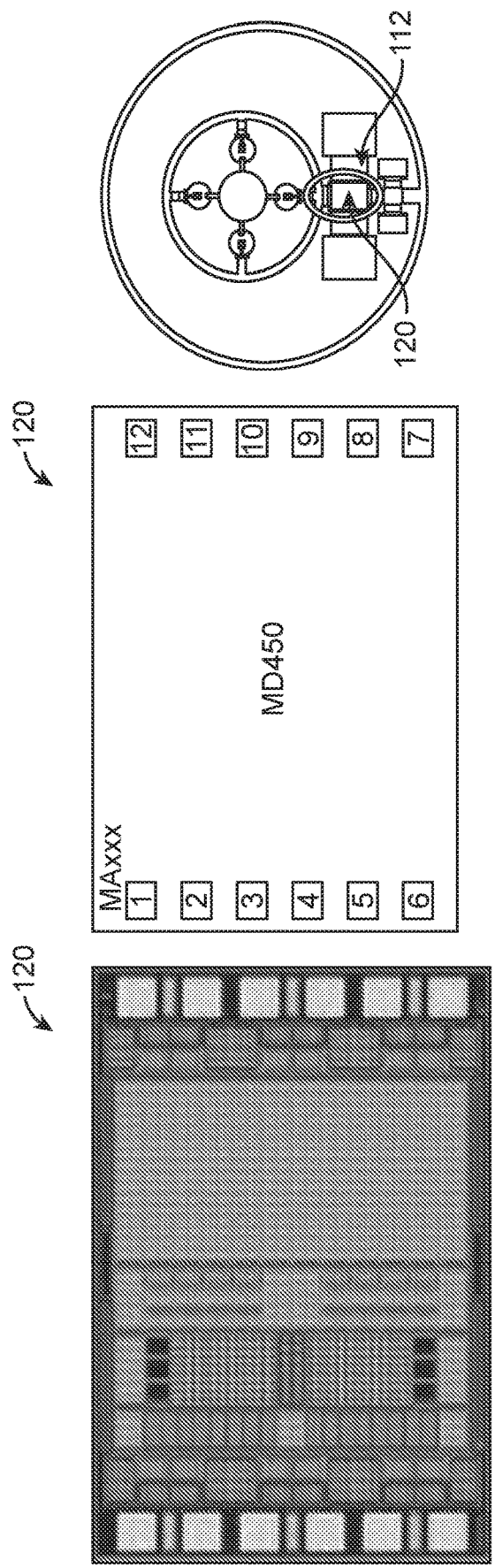
FIGS. 12A to 12C shows the assembly process and components for placing the processor such as a microcontroller or ASIC on the flexible PCB.

FIGS. 12A to 12C shows the assembly process and components for placing the processor such as a microcontroller or ASIC 120 on the flexible PCB. A processor 120 suitable for placement on the flex PCB is shown in FIG. 12A. A microcontroller such as μC EM6819 from EM Marin may be used. A reduction in power consumption and footprint may be achieved by using a semi-custom ASIC such as the MD450, supplied by Microdul. In some embodiments, dimensions of the microcontroller are 2.2 mm×1.9 mm×0.28 mm, and the dimensions of the ASIC are 1.07 mm×1.56 mm×0.1 mm. Other processors from other vendors may be used with different dimensions. The processor 120 may have dimensions known to one of ordinary skill in the art.

As shown in FIG. 12B, the flexible PCB comprises pads for bonding with the corresponding pads of the processor, e.g. ASIC or microcontroller. The number of pads on the processor and flex printed circuit board can each be any suitable number of pads, for example within a range from about 6 to about 60, for example within a range from about 10 to about 40. FIG. 12B shows locations of pads for the MD450 as an example, and these pads can be located on the flex PCB at any suitable location. The dimensions of each of the pads can be within a range from about 50 microns to about 150 micros, for example within a range from about 70 microns to about 100 microns.

As shown in FIG. 12C, the processor can be placed on the flexible PCB between the batteries, for example as shown with the circle. The pads to bond the processor can be appropriately located on the flex PCB with corresponding dimensions and sizes. Processor 120 may have a before saw dimension of about 1.56 mm×1.07 mm and a after saw dimension of about 1.52 mm×1.03 mm Bonding pad openings can be 68 microns×68 microns for the microcontroller and 86 microns×86 microns for the ASIC. Pitch for the microcontroller can be within a range from 100 to 200 microns while that for the ASIC can be within a range from 140 to 170 microns, for example. The contact material may comprise Al coated with gold bumps. The number of contacts may comprise any suitable number, for example 30 in the microcontroller and 12 in the ASIC. The assembly technology may comprise gold wire bonding.

Prior to integration into the soft contact lens body, the electro-optic module can be coated with a multilayer coating that forms a hermetic seal around the electro-optical assembly. For example, a multilayer coating developed and supplied by COAT-X comprises alternating layers of Parylene C and SiOx, each layer being 0.5-1.5 microns in thickness, for example. In some embodiments from 5 to 15 layers are deposited (e.g. 12), by deposition process such as a chemical vapor deposition (CVD) process. Prior to the CVD treatment, the surface of the flexible PCB substrate may be activated to enhance bonding to the multilayer coating. In some embodiments, bonding is enhanced by applying a different layer of material to the surface for the flex PCB to render the surface hydrophilic, for example by applying a layer of SiOx to a polyimide surface flexible PCB. For example, an oxygen plasma treatment may be applied to form hydrophilic groups such as hydroxyl and carboxyl groups on the surface of the polyimide. Another approach is to coat the flexible PCB substrate with a thin layer of a biocompatible, aliphatic poly-siloxane layer, such as a cross-linked poly-dimethyl siloxane, such as Silastic, so as to adhere to the SiOx layer that is deposited as the first layer of the hermetically sealing coating. In some embodiments, an adhesion promoting approach is used, as described in U.S. Pat. No. 9,345,813, the entirety of which is incorporated herein by reference.

Once assembly is completed, the electro-optic module mounted on the flexible transparent polymer film is ready to be integrated into a soft contact lens. This can be done in many ways. In some embodiments, the assembly is performed in accordance with one or more steps of the method shown in FIG. 6. In some embodiments, the contact lens comprises a composite soft contact lens comprising at least three layers.

As described herein, the computing devices and systems described and/or illustrated herein broadly represent any type or form of computing device or system capable of executing computer-readable instructions, such as those contained within the modules described herein. In their most basic configuration, these computing device(s) may each comprise at least one memory device and at least one physical processor.

The term "memory" or "memory device," as used herein, generally represents any type or form of volatile or non-volatile storage device or medium capable of storing data and/or computer-readable instructions. In one example, a memory device may store, load, and/or maintain one or more of the modules described herein. Examples of memory devices comprise, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In addition, the term "processor" or "physical processor," as used herein, generally refers to any type or form of hardware-implemented processing unit capable of interpreting and/or executing computer-readable instructions. In one example, a physical processor may access and/or modify one or more modules stored in the above-described memory device. Examples of physical processors comprise, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the method steps described and/or illustrated herein may represent portions of a single application. In addition, in some embodiments one or more of these steps may represent or correspond to one or more software applications or programs that, when executed by a computing device, may cause the computing device to perform one or more tasks, such as the method step.

In addition, one or more of the devices described herein may transform data, physical devices, and/or representations of physical devices from one form to another. Additionally or alternatively, one or more of the modules recited herein may transform a processor, volatile memory, non-volatile memory, and/or any other portion of a physical computing device from one form of computing device to another form of computing device by executing on the computing device, storing data on the computing device, and/or otherwise interacting with the computing device.

The term "computer-readable medium," as used herein, generally refers to any form of device, carrier, or medium capable of storing or carrying computer-readable instructions. Examples of computer-readable media comprise, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

A person of ordinary skill in the art will recognize that any process or method disclosed herein can be modified in many ways. The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed.

The various exemplary methods described and/or illustrated herein may also omit one or more of the steps described or illustrated herein or comprise additional steps in addition to those disclosed. Further, a step of any method as disclosed herein can be combined with any one or more steps of any other method as disclosed herein.

The processor as described herein can be configured to perform one or more steps of any method disclosed herein. Alternatively or in combination, the processor can be configured to combine one or more steps of one or more methods as disclosed herein.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and shall have the same meaning as the word "comprising.

The processor as disclosed herein can be configured with instructions to perform any one or more steps of any method as disclosed herein.

It will be understood that although the terms "first," "second," "third", etc. may be used herein to describe various layers, elements, components, regions or sections without referring to any particular order or sequence of events. These terms are merely used to distinguish one layer, element, component, region or section from another layer, element, component, region or section. A first layer, element, component, region or section as described herein could be referred to as a second layer, element, component, region or section without departing from the teachings of the present disclosure.

As used herein, the term "or" is used inclusively to refer items in the alternative and in combination.

As used herein, characters such as numerals refer to like elements.

The present disclosure includes the following numbered clauses.

Clause 1. A method of manufacturing a contact lens comprising: placing an opto-electronic module on a layer of a contact lens material, the opto-electronic module comprising a plurality of light sources, the plurality light sources configured to direct light to a periphery of the retina within the range of eccentricity of 10 degrees to 50 degrees.

Clause 2. The method of clause 1, wherein the opto-electronic module comprises a flex PCB with bendable portions to shape the opto-electronics module to fit between anterior and posterior portions of the lens.

Clause 3. The method of clause 1, wherein the opto-electronic module comprises a central aperture and wherein the plurality of light sources is supported with a plurality of extensions extending toward a center of the opto-electronics module and optionally wherein the center of the opto-electronics module corresponds to a center of an optical zone of the contact lens.

Clause 4. The method of clause 1, further comprising: coupling a plurality of projection optics to a plurality of OLEDs or i-LEDs to the plurality of projection optics prior to placing the opto-electronic module on the layer.

Clause 5. The method of clause 4, wherein the plurality of OLEDs or i-LEDs has been coupled to a flex PCB prior to coupling the plurality of projection optics to the plurality of OLEDs or i-LEDs.

Clause 6. The method of clause 4, wherein each of the plurality of projection optics comprises one or more of a lens or a mirror and optionally wherein said each of the plurality of projection optics comprises a convex and a concave mirror arranged to substantially collimate light emitted from an OLED or i-LED.

Clause 7. The method of clause 1, wherein each of the plurality of light sources comprises an OLED or an i-LED and one or more projection optics.

Clause 8. The method of clause 1, wherein the plurality of light sources is configured to emit a plurality of light beams, to overlap the plurality of beams within the eye, and to illuminate the periphery of the retina at non-overlapping locations and optionally wherein each of the plurality of light sources illuminates the periphery of the retina on an opposite side of the retina in relation to a location of said each light source on the contact lens.

Clause 9. The method of clause 1, wherein the opto-electronic module is placed between a first contact lens component comprising the layer and a second contact lens component comprising a second layer and wherein the opto-electronic module is coupled to the first layer and the second layer.

Clause 10. The method of clause 9, wherein one or more of the first component or the second component is shaped to receive the opto-electronic module between the first component and the second component.

Clause 11. The method of clause 9, wherein one or more of the first component or the second component is shaped to define a gap extending between the first component and the second component, the gap sized to receive the opto-electronic module.

Clause 12. The method of clause 1, wherein the contact lens comprising the opto-electronics module is configured to provide defocused light to the eye to alter one or more of an axial length of the eye, a growth of axial length of the eye, or a choroidal thickness of the eye.

Clause 13. The method of clause 1, further comprising: providing the contact lens to a patient; and measuring the axial length of the patient's eye after providing the contact lens to the patient.

Clause 14. The method of clause 13, wherein measuring the axial length of the patient's eye comprises measuring the axial length of the patient's eye at the fovea and one or more locations eccentric to the fovea.

Clause 15. An opto-electronics module configured for placement in a contact lens, the opto-electronics module comprising: a flex PCB defining a central aperture; a plurality of light sources configured to direct light to a periphery of a retina; wherein the plurality of light sources is supported with a plurality of extensions extending toward a center of the central aperture.

Clause 16. The opto-electronics module of clause 15, wherein each of said plurality of light sources comprises one or more of an OLED, i-LED, or a projection optic.

Clause 17. A method of assembly of an electronic soft contact lens wherein said lens has a maximum thickness of 350 microns and comprises a plurality of light sources to project a plurality of images on a periphery of a retina of a wearer.

Clause 18. The method of clause 17, wherein said lens comprises a flexible printed circuit board with electronic and optical components are mounted on said flexible printed circuit board.

Clause 19. The method of clause 17, wherein said lens comprises one or more of a processor, an antenna located near a periphery of said lens, a rechargeable battery or a one capacitor.

Clause 20. The method of clause 17, wherein said lens comprises the processor, the antenna located near the periphery of said lens, the rechargeable battery and the capacitor.

Clause 21. The method of clause 20, wherein the capacitor comprises a plurality of capacitors and the battery comprises a plurality of batteries.

Clause 22. The method, contact lens or opto-electronic module of any one of the preceding clauses, wherein the periphery of the retina comprises a region of the retina located away from a fovea of an eye of a wearer.

Embodiments of the present disclosure have been shown and described as set forth herein and are provided by way of example only. One of ordinary skill in the art will recognize numerous adaptations, changes, variations and substitutions without departing from the scope of the present disclosure. Several alternatives and combinations of the embodiments disclosed herein may be utilized without departing from the scope of the present disclosure and the inventions disclosed herein. Therefore, the scope of the presently disclosed inventions shall be defined solely by the scope of the appended claims and the equivalents thereof.

What is claimed is:

1. A method of manufacturing a lens comprising:
   placing an opto-electronic module on a layer of a lens material, the opto-electronic module comprising a plurality of light sources, the plurality light sources configured to direct light to a periphery of a retina of an eye within the range of eccentricity of 10 degrees to 50 degrees;
   wherein the plurality of light sources is configured to emit a plurality of light beams, to overlap the plurality of light beams within the eye, and to illuminate the periphery of the retina at non-overlapping locations and each of the plurality of light sources is configured to illuminate the periphery of the retina on an opposite side of the retina in relation to a location of said each light source on the lens.

2. The method of claim 1, wherein the opto-electronic module comprises a flex PCB with bendable portions to shape the opto-electronics module to fit between anterior and posterior portions of the lens.

3. The method of claim 1, wherein the opto-electronic module comprises a central aperture and wherein the plurality of light sources is supported with a plurality of extensions extending toward a center of the opto-electronics module and optionally wherein the center of the opto-electronics module corresponds to a center of an optical zone of the lens.

4. The method of claim 1, further comprising:
   coupling a plurality of projection optics to a plurality of OLEDs or i-LEDs to the plurality of projection optics prior to placing the opto-electronic module on the layer.

5. The method of claim 4, wherein the plurality of OLEDs or i-LEDs has been coupled to a flex PCB prior to coupling the plurality of projection optics to the plurality of OLEDs or i-LEDs.

6. The method of claim 4, wherein each of the plurality of projection optics comprises one or more of a lens or a mirror and wherein said each of the plurality of projection optics comprises a convex and a concave mirror arranged to substantially collimate light emitted from an OLED or i-LED.

7. The method of claim 1, wherein each of the plurality of light sources comprises an OLED or an i-LED and one or more projection optics.

8. The method of claim 1, wherein the opto-electronic module is placed between a first lens component comprising the layer and a second lens component comprising a second layer and wherein the opto-electronic module is coupled to the first layer and the second layer.

9. The method of claim 8, wherein one or more of the first lens component or the lens second component is shaped to receive the opto-electronic module between the first lens component and the second lens component.

10. The method of claim 8, wherein one or more of the first lens component or the second lens component is shaped to define a gap extending between the first lens component and the second lens component, the gap sized to receive the opto-electronic module.

11. The method of claim 1, wherein the lens comprising the opto-electronics module is configured to provide defocused light to the eye to alter one or more of an axial length of the eye, a growth of the axial length of the eye, or a choroidal thickness of the eye.

12. The method of claim 1, further comprising:
providing the lens to a patient; and
measuring the axial length of the patient's eye after providing the contact lens to the patient.

13. The method of claim 12, wherein measuring the axial length of the patient's eye comprises measuring the axial length of the patient's eye at the fovea and one or more locations eccentric to the fovea.

14. An opto-electronics module configured for placement in a lens, the opto-electronics module comprising:
a flex PCB defining a central aperture; and
a plurality of light sources configured to direct light to a periphery of a retina of an eye;
wherein the plurality of light sources is supported with a plurality of extensions extending toward a center of the central aperture;
wherein the plurality of light sources is configured to emit a plurality of light beams, to overlap the plurality of light beams within the eye, and to illuminate the periphery of the retina at non-overlapping locations and each of the plurality of light sources is configured to illuminate the periphery of the retina on an opposite side of the retina in relation to a location of said each light source on the lens.

15. The opto-electronics module of claim 14, wherein each of said plurality of light sources comprises one or more of an OLED, i-LED, or a projection optic.

16. The method of claim 1, wherein said lens has a maximum thickness of 350 microns.

17. The method of claim 16, wherein said lens comprises a flexible printed circuit board with electronic and optical components are mounted on said flexible printed circuit board.

18. The method of claim 16, wherein said lens comprises one or more of a processor, an antenna located near a periphery of said lens, a rechargeable battery or a one capacitor.

19. The method of claim 16, wherein said lens comprises a processor, an antenna located near a periphery of said lens, a rechargeable battery and a capacitor.

20. The method of claim 19, wherein the capacitor comprises a plurality of capacitors and the rechargeable battery comprises a plurality of batteries.

\* \* \* \* \*